(12) United States Patent
Zhao et al.

(10) Patent No.: US 12,543,445 B2
(45) Date of Patent: Feb. 3, 2026

(54) DISPLAY SUBSTRATE

(71) Applicant: BOE TECHNOLOGY GROUP CO., LTD., Beijing (CN)

(72) Inventors: Lei Zhao, Beijing (CN); Zhiqiang Jiao, Beijing (CN); Xiaohu Li, Beijing (CN); Xiaoyun Liu, Beijing (CN); Shuilang Dong, Beijing (CN); Guangcai Yuan, Beijing (CN); Lilei Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 484 days.

(21) Appl. No.: 17/920,626

(22) PCT Filed: Nov. 29, 2021

(86) PCT No.: PCT/CN2021/133886
§ 371 (c)(1),
(2) Date: Oct. 21, 2022

(87) PCT Pub. No.: WO2023/092535
PCT Pub. Date: Jun. 1, 2023

(65) Prior Publication Data
US 2024/0215318 A1 Jun. 27, 2024

(51) Int. Cl.
*H10K 59/122* (2023.01)
*H10K 50/19* (2023.01)
(Continued)

(52) U.S. Cl.
CPC ........... *H10K 59/122* (2023.02); *H10K 50/19* (2023.02); *H10K 59/1201* (2023.02); *H10K 59/80517* (2023.02); *H10K 71/60* (2023.02)

(58) Field of Classification Search
CPC .................................................. H10K 59/122
See application file for complete search history.

(56) References Cited

U.S. PATENT DOCUMENTS 8,729,539 B2   5/2014   Kakinuma et al.
8,754,414 B2   6/2014   Moon et al.
(Continued)

FOREIGN PATENT DOCUMENTS

CN   102272970 A   12/2011
CN   102916031 A   2/2013
(Continued)

OTHER PUBLICATIONS

International Search Report of PCT/CN2021/133886 in Chinese mailed May 9, 2022 in Chinese.
(Continued)

*Primary Examiner* — Evren Seven
(74) *Attorney, Agent, or Firm* — Collard & Roe, P.C.

(57) ABSTRACT

A display substrate is provided, the display substrate has a plurality of sub-pixels, and includes a driving circuit substrate, a plurality of first electrodes, a pixel definition layer and a light-emitting material layer. The driving circuit substrate includes a plurality of pixel driving circuits and a protective insulating layer, the protective insulating layer includes a plurality of first vias, and the plurality of first electrodes are respectively electrically connected to output terminals of the plurality of pixel driving circuits through the first vias. The pixel definition layer includes a plurality of sub-pixel openings and at least one partition structure. The light-emitting material layer is at least in the plurality of sub-pixel openings, the pixel definition layer includes a first pixel definition sub-layer and a second pixel definition sub-layer, and a width of the second pixel definition sub-layer is greater than a width of the first pixel defining sub-layer.

18 Claims, 16 Drawing Sheets

(51) Int. Cl.
*H10K 59/12* (2023.01)
*H10K 59/80* (2023.01)
*H10K 71/60* (2023.01)

(56) References Cited

U.S. PATENT DOCUMENTS

| | | |
|---|---|---|
| 8,866,160 B2 | 10/2014 | Nishiyama |
| 10,330,993 B2 | 6/2019 | Toyotaka |
| 10,811,491 B2 | 10/2020 | Fan |
| 10,826,027 B2 * | 11/2020 | Hu .................. H10K 59/80 |
| 10,971,551 B2 | 4/2021 | Wang |
| 11,121,197 B2 | 9/2021 | Huang et al. |
| 12,185,590 B2 | 12/2024 | Kinjo |
| 2003/0132703 A1 | 7/2003 | Sakaguchi |
| 2010/0252857 A1 | 10/2010 | Nakatani et al. |
| 2011/0291086 A1 * | 12/2011 | Nishiyama .......... H10K 71/00 438/46 |
| 2014/0027731 A1 * | 1/2014 | Kim .................. H10K 71/60 257/40 |
| 2014/0042400 A1 | 2/2014 | Kim et al. |
| 2014/0353595 A1 * | 12/2014 | Choi .................. H10K 59/00 257/40 |
| 2015/0144906 A1 | 5/2015 | Ichikawa |
| 2016/0049613 A1 | 2/2016 | Kang et al. |
| 2016/0079325 A1 | 3/2016 | Lee et al. |
| 2016/0293888 A1 | 10/2016 | Shim et al. |
| 2017/0133620 A1 | 5/2017 | Lee et al. |
| 2017/0170243 A1 | 6/2017 | An et al. |
| 2019/0097161 A1 | 3/2019 | Im et al. |
| 2019/0131365 A1 | 5/2019 | Jung |
| 2019/0172898 A1 | 6/2019 | Choi |
| 2019/0181199 A1 | 6/2019 | Choi et al. |
| 2019/0229152 A1 | 7/2019 | Wang |
| 2019/0386090 A1 | 12/2019 | Chen et al. |
| 2020/0203469 A1 | 6/2020 | Li et al. |
| 2021/0202686 A1 | 7/2021 | Jeon et al. |
| 2022/0085330 A1 | 3/2022 | Yan et al. |
| 2022/0115469 A1 | 4/2022 | Huang et al. |
| 2022/0384531 A1 | 12/2022 | Xu et al. |
| 2022/0392968 A1 | 12/2022 | Liu et al. |
| 2022/0393132 A1 * | 12/2022 | Nishikawa ........... H10K 50/82 |
| 2024/0047471 A1 | 2/2024 | Huang et al. |

FOREIGN PATENT DOCUMENTS

| | | |
|---|---|---|
| CN | 103311268 A | 9/2013 |
| CN | 107170788 A | 9/2017 |
| CN | 107425131 A | 12/2017 |
| CN | 108242459 A | 7/2018 |
| CN | 109103217 A | 12/2018 |
| CN | 109346505 A | 2/2019 |
| CN | 109599502 A | 4/2019 |
| CN | 110299469 A | 10/2019 |
| CN | 110416279 A | 11/2019 |
| CN | 110416434 A | 11/2019 |
| CN | 110993806 A | 4/2020 |
| CN | 111668380 A | 9/2020 |
| CN | 111722761 A | 9/2020 |
| CN | 113066834 A | 7/2021 |
| CN | 113130598 A1 | 7/2021 |
| CN | 113410268 A | 9/2021 |
| CN | 113659098 A | 11/2021 |
| CN | 214672621 U | 11/2021 |
| CN | 114361222 A | 4/2022 |
| JP | 2001060494 A | 3/2001 |
| JP | 2008039843 A | 2/2008 |
| KR | 10-2006-0091665 A | 8/2006 |
| KR | 10-2008-0061918 A | 7/2008 |
| KR | 10-2008-0080974 A | 9/2008 |
| KR | 10-2020-0034158 A | 3/2020 |
| KR | 10-2020-0082491 A | 7/2020 |
| WO | 2021/085176 A1 | 5/2021 |
| WO | 2021/139660 A1 | 7/2021 |
| WO | 2021212333 A1 | 10/2021 |

OTHER PUBLICATIONS

Written Opinion of the International Searching Authority of PCT/CN2021/133886 mailed May 9, 2022 in Chinese.
International Search Report of PCT/CN2021/133886 in Chinese mailed May 9, 2022 in English.
Extended European Search Report in European Application No. 21965268.2 dated Jul. 5, 2024.
Written Opinion of the international Search Authority in PCT/CN2021/133886 mailed May 9, 2022 in English.
European Office Action in European Application No. 21965268.2 dated Aug. 25, 2025.
U.S. Non-Final Office Action in U.S. Appl. No. 18/026,365 dated Oct. 31, 2025.
U.S. Office Action in U.S. Appl. No. 18/257,593 dated Dec. 2, 2025.

* cited by examiner

| EIL |
| :---: |
| ETL |
| EML3 |
| EBL |
| HTL |
| P-CGL |
| N-CGL |
| ETL |
| EML2 |
| EML1 |
| EBL |
| HTL |
| HIL |

FIG. 27

| EIL |
| :---: |
| ETL |
| EML3 |
| EBL |
| HTL |
| P-CGL |
| N-CGL |
| ETL |
| EML2 |
| EBL |
| HTL |
| P-CGL |
| N-CGL |
| ETL |
| EML1 |
| EBL |
| HTL |
| HIL |

FIG. 28

DISPLAY SUBSTRATE

CROSS REFERENCE TO RELATED APPLICATIONS

This application is the National Stage of PCT/CN2021/133886 filed on Nov. 29, 2021, the disclosure of which is incorporated by reference.

TECHNICAL FIELD

Embodiments of the present disclosure relate to a display substrate.

BACKGROUND

Silicon-based micro-display organic light-emitting display panels have advantages of miniaturization and high PPI (Pixel Per Inch), and have gradually become the focus of attention in the display field. The silicon-based micro-display organic light-emitting display panel can be used in, for example, virtual reality (VR) technology and augmented reality (AR) technology, and can achieve excellent display effects.

SUMMARY

At least one embodiment of the present disclosure provides a display substrate, which has a plurality of sub-pixels arranged in an array, and comprises a driving circuit substrate, a plurality of first electrodes, a pixel definition layer, and a light-emitting material layer; the driving circuit substrate comprises a plurality of pixel driving circuits for the plurality of sub-pixels and a protective insulating layer covering the plurality of pixel driving circuits, the protective insulating layer comprises a plurality of first vias exposing output terminals of the plurality of pixel driving circuits; the plurality of first electrodes are on the driving circuit substrate and respectively electrically connected to the output terminals of the plurality of pixel driving circuits through the plurality of first vias; the pixel definition layer is at least on a side of the plurality of first electrodes away from the driving circuit substrate, and comprises a plurality of sub-pixel openings respectively exposing the plurality of first electrodes and comprises at least one partition structure on the pixel definition layer; and the light-emitting material layer is on a side of the pixel definition layer away from the driving circuit substrate and at least in the plurality of sub-pixel openings, the pixel definition layer comprises a first pixel definition sub-layer and a second pixel definition sub-layer, the second pixel definition sub-layer is on a side of the first pixel definition sub-layer away from the driving circuit substrate, and a width of the second pixel definition sub-layer is greater than a width of the first pixel definition sub-layer.

For example, in the display substrate provided by at least one embodiment of the present disclosure, the protective insulating layer, at a position of the at least one partition structure and regions except the first vias, is a flat structure.

For example, in the display substrate provided by at least one embodiment of the present disclosure, a sidewall of each of the at least one partition structure comprises a first notch.

For example, in the display substrate provided by at least one embodiment of the present disclosure, at a position of the at least one partition structure, the first pixel definition sub-layer is inwardly shrunk relative to the second pixel definition sub-layer to form the first notch.

For example, in the display substrate provided by at least one embodiment of the present disclosure, the width of the second pixel definition sub-layer is smaller than a width between adjacent first electrodes.

For example, in the display substrate provided by at least one embodiment of the present disclosure, the first pixel definition sub-layer comprises an inorganic insulating material, and the second pixel definition sub-layer comprises an inorganic insulating material or a metal oxide material.

For example, in the display substrate provided by at least one embodiment of the present disclosure, a thickness of the first pixel definition sub-layer is greater than a thickness of the second pixel definition sub-layer.

For example, in the display substrate provided by at least one embodiment of the present disclosure, the at least one partition structure comprises a plurality of first partition structures, the plurality of first partition structures respectively surround the plurality of sub-pixel openings, and first notches of the plurality of first partition structures respectively face the plurality of sub-pixel openings.

For example, in the display substrate provided by at least one embodiment of the present disclosure, a distance between a surface of the first pixel definition sub-layer close to the driving circuit substrate and the driving circuit substrate is greater than a distance between surfaces of the plurality of first electrodes away from the driving circuit substrate and the driving circuit substrate.

For example, in the display substrate provided by at least one embodiment of the present disclosure, the at least one partition structure further comprises a plurality of second partition structures, and the plurality of second partition structures are respectively arranged between two adjacent first partition structures in the plurality of first partition structures.

For example, in the display substrate provided by at least one embodiment of the present disclosure, a distance between the plurality of first partition structures and the driving circuit substrate is equal to a distance between the plurality of second partition structures and the driving circuit substrate; or the distance between the plurality of first partition structures and the driving circuit substrate is greater than the distance between the plurality of second partition structures and the driving circuit substrate.

For example, in the display substrate provided by at least one embodiment of the present disclosure, the second pixel definition sub-layer has a first slope angle at sidewalls of the plurality of first partition structures, and the first slope angle ranges from 30° to 75°; and the second pixel definition sub-layer has a second slope angle at sidewalls of the plurality of second partition structures, and the second slope angle ranges from 30° to 80°.

For example, in the display substrate provided by at least one embodiment of the present disclosure, a slope angle of the first pixel definition sub-layer at the sidewalls of the plurality of first partition structures is greater than a slope angle of the second pixel definition sub-layer at the sidewalls of the plurality of first partition structures.

For example, in the display substrate provided by at least one embodiment of the present disclosure, the light-emitting material layer is disconnected at the first notch, the light-emitting material layer comprises a first portion for emitting light and a second portion not used for emitting light, the light-emitting material layer is disconnected at a position of the second portion, and a slope angle of the first portion is larger than a slope angle of the second portion at a disconnected position.

For example, in the display substrate provided by at least one embodiment of the present disclosure, a depth of the first notch in a direction parallel to a surface of the base substrate is greater than a thickness of the first pixel definition sub-layer and a thickness of the second pixel definition sub-layer in a direction perpendicular to the surface of the base substrate.

For example, in the display substrate provided by at least one embodiment of the present disclosure, a thickness of the light-emitting material layer is greater than the thickness of the first pixel definition sub-layer and greater than the thickness of the second pixel definition sub-layer.

For example, in the display substrate provided by at least one embodiment of the present disclosure, the light-emitting material layer further comprises a third slope portion away from the disconnected position, and a slope angle of the third slope portion is smaller than a slope angle of the first portion close to the disconnected position and is smaller than a slope angle of the second portion close to the disconnected position.

For example, in the display substrate provided by at least one embodiment of the present disclosure, the pixel definition layer comprises a fourth slope portion at a position corresponding to the third slope portion, and a slope angle of the fourth slope portion is greater than a slope angle of the third slope portion.

For example, in the display substrate provided by at least one embodiment of the present disclosure, the slope angle of the fourth slope portion is smaller than the slope angle of the first portion close to the disconnected position.

For example, in the display substrate provided by at least one embodiment of the present disclosure, the slope angle of the fourth slope portion is smaller than the slope angle of the second portion close to the disconnected position.

For example, the display substrate provided by at least one embodiment of the present disclosure further comprises a first auxiliary electrode layer on a side of the first pixel definition sub-layer close to the driving circuit substrate and exposed by the plurality of second partition structures.

For example, in the display substrate provided by at least one embodiment of the present disclosure, the first pixel definition sub-layer covers an edge of the first auxiliary electrode layer.

For example, in the display substrate provided by at least one embodiment of the present disclosure, a width of the first auxiliary electrode layer is greater than a depth of the first notch in a direction parallel to a surface of the base substrate.

For example, in the display substrate provided by at least one embodiment of the present disclosure, the at least one partition structure comprises a plurality of second partition structures, and the plurality of second partition structures are respectively arranged between the plurality of first electrodes.

For example, in the display substrate provided by at least one embodiment of the present disclosure, a distance between a surface of the first pixel definition sub-layer away from the driving circuit substrate and the driving circuit substrate is smaller than a distance between surfaces of the plurality of first electrodes away from the driving circuit substrate and the driving circuit substrate.

For example, the display substrate provided by at least one embodiment of the present disclosure further comprises: a first auxiliary electrode layer on a side of the first pixel definition sub-layer close to the driving circuit substrate and exposed by the plurality of second partition structures; and/or a second auxiliary electrode layer on a side of the second pixel definition sub-layer away from the driving circuit substrate.

For example, in the display substrate provided by at least one embodiment of the present disclosure, the first pixel definition sub-layer is inwardly shrunk by 10 nm-200 nm relative to the second pixel definition sub-layer.

For example, in the display substrate provided by at least one embodiment of the present disclosure, a sidewall of each of the plurality of second partition structures further comprises a second notch, and the second notch is on a side of the first notch away from the driving circuit substrate.

For example, in the display substrate provided by at least one embodiment of the present disclosure, the pixel definition layer further comprises a third pixel definition sub-layer and a fourth pixel definition sub-layer that are stacked, the third pixel definition sub-layer is on a side of the second pixel definition sub-layer away from the driving circuit substrate, and the fourth pixel definition sub-layer is on a side of the third pixel definition sub-layer away from the driving circuit substrate; and the third pixel definition sub-layer is inwardly shrunk relative to the fourth pixel definition sub-layer at positions of the plurality of second partition structures, so as to form the second notch.

For example, in the display substrate provided by at least one embodiment of the present disclosure, the light-emitting material layer comprises at least one charge generation layer or at least one hole injection layer.

For example, the display substrate provided by at least one embodiment of the present disclosure further comprises: a first auxiliary electrode layer on a side of the first pixel definition sub-layer close to the driving circuit substrate and exposed by the plurality of second partition structures; and/or a second auxiliary electrode layer on a side of the second pixel definition sub-layer away from the driving circuit substrate; and/or a third auxiliary electrode layer on a side of the fourth pixel definition sub-layer away from the driving circuit substrate.

For example, in the display substrate provided by at least one embodiment of the present disclosure, materials of the first auxiliary electrode layer and/or the second auxiliary electrode layer and/or the third auxiliary electrode layer comprise at least one selected from a group consisting of: Al, Ti, TiN, Ag, Mo, ITO and IZO.

For example, in the display substrate provided by at least one embodiment of the present disclosure, the second pixel definition sub-layer is disconnected by a first distance at a position of the first notch, and the fourth pixel definition sub-layer is disconnected by a second distance at a position of the second notch; and the second distance is greater than the first distance by 100 nm-500 nm.

For example, the display substrate provided by at least one embodiment of the present disclosure further comprises: a first auxiliary electrode layer on a side of the first pixel definition sub-layer close to the driving circuit substrate and exposed by the plurality of second partition structures, a width of the first auxiliary electrode layer is greater than the first distance.

For example, in the display substrate provided by at least one embodiment of the present disclosure, the first pixel definition sub-layer is inwardly shrunk by 50 nm-200 nm relative to the second pixel definition sub-layer; and the third pixel definition sub-layer is inwardly shrunk by 50 nm-200 nm relative to the fourth pixel definition sub-layer.

For example, in the display substrate provided by at least one embodiment of the present disclosure, the first auxiliary electrode is in a same layer as at least part of the plurality of first electrodes and is spaced apart from the at least part of the plurality of first electrodes.

For example, the display substrate provided by at least one embodiment of the present disclosure further comprises: a second electrode layer on a side of the light-emitting material layer away from the driving circuit substrate and at least in the plurality of sub-pixel openings, the second electrode layer is continuously arranged.

For example, in the display substrate provided by at least one embodiment of the present disclosure, the second electrode layer comprises a fifth slope portion and a sixth slope portion respectively at the disconnected position corresponding to the first portion and a position of the third slope portion, a slope angle of the fifth slope portion is smaller than a slope angle of the first portion at the disconnected position, and a slope angle of the sixth slope portion is smaller than a slope angle of the third slope portion.

For example, in the display substrate provided by at least one embodiment of the present disclosure, the light-emitting material layer is a flat structure between the first portion at the disconnected position and the third slope portion, and the second electrode layer is a flat structure between the fifth slope portion and the sixth slope portion.

For example, the display substrate provided by at least one embodiment of the present disclosure further comprises: a light-extraction layer, on a side of the second electrode layer away from the driving circuit substrate, a refractive index of the light-extraction layer ranges from 1.3 to 1.7.

For example, in the display substrate provided by at least one embodiment of the present disclosure, a material of the light-extraction layer comprises at least one selected from a group consisting of: LiF, SiOx, and $Al_2O_3$.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

FIG. 26-FIG. 28 are schematic diagrams of various structures of a light-emitting device in a display substrate provided by at least one embodiment of the present disclosure;

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

Figure 1A:
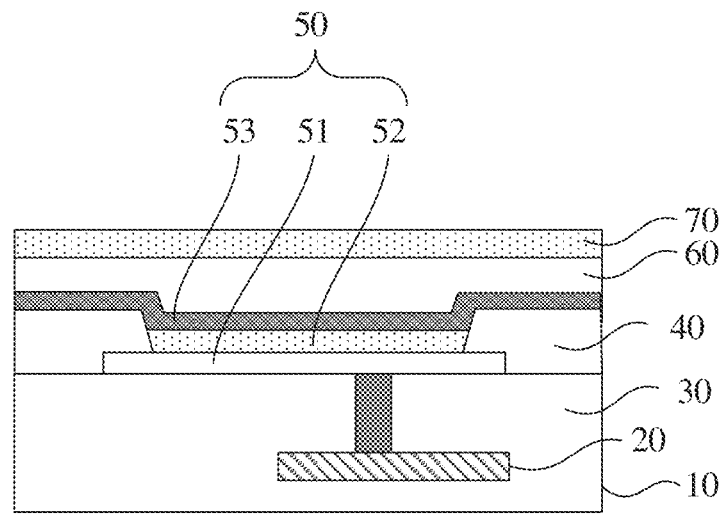
FIG. 1A is a schematic cross-sectional view of a display substrate.

Micro OLED belongs to a silicon-based display device. Due to the excellent electrical properties and extremely small device size of silicon-based devices, it is beneficial to achieve high integration. For example, FIG. 1A illustrates a schematic cross-sectional view of a silicon-based display substrate. As illustrated in FIG. 1A, the silicon-based display substrate includes structures such as a driving circuit substrate 10, a plurality of light-emitting devices 50, and the like.

For example, the silicon-based display substrate includes a plurality of sub-pixels arranged in an array, each sub-pixel includes a light-emitting device 50 and a driving circuit 20 in the driving circuit substrate 10, and the driving circuit 20 is configured to drive the light-emitting device 50 to emit light. The light-emitting device 50 includes an anode 51, a light-emitting material layer 52 and a cathode 53, and the anode 21 is connected to the driving circuit 20 through a via in the insulating layer 30. A pixel definition layer 40 is provided on the anode 51, the pixel definition layer 40 includes a plurality of sub-pixel openings, and each sub-pixel opening exposes an anode 51 of one light-emitting device 50, thereby defining a light-emitting region of the light-emitting device 50, that is, defining an active light-emitting region of the sub-pixel, that is, a region other than the orthographic projection of the pixel definition layer 40 on the anode 51.

Figure 1B:
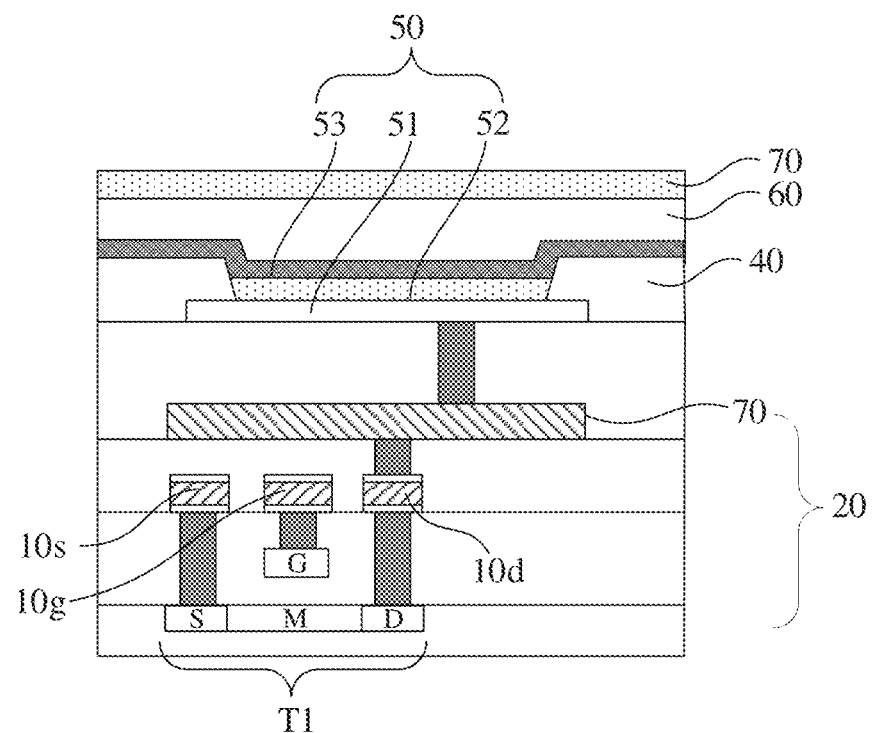
FIG. 1B is another schematic cross-sectional view of a display substrate.

For example, FIG. 1B illustrates another schematic cross-sectional view of a silicon-based display substrate. In some embodiments, as illustrated in FIG. 1B, the driving circuit 20 includes structures such as a driving transistor T1, a connection electrode 70, and the like. The driving transistor T1 includes a source electrode S, a drain electrode D and a semiconductor layer M, the semiconductor layer M is between the source electrode S and the drain electrode D, and one of the source electrode S and the drain electrode D (here, the drain electrode D) is electrically connected to the anode 51 through the connection electrode 70. The semiconductor layer M is, for example, a channel region formed between the source electrode S and the drain electrode D.

For example, as illustrated in FIG. 1B. the driving transistor T1 further includes a gate electrode G, and the gate electrode G, the source electrode S and the drain electrode D respectively correspond to three electrode connection portions. For example, the gate electrode G is electrically connected to a gate electrode connection portion 10g, the source electrode S is electrically connected to a source electrode connection portion 10s, and the drain electrode D is electrically connected to a drain electrode connection portion 10d. For example, the drain electrode D of the driving transistor T1 is electrically connected to the connection electrode 70 through the drain electrode connection portion 10d, and the gate electrode G and the source electrode S are electrically connected to a scan line and a power line through the gate electrode connection portion 10g and the source electrode connection portion 10s, respectively. In the case where a turn-on signal is provided on the scan line, the driving transistor T1 is in a turn-on state, and an electrical signal provided by the power line can be transmitted to the anode 51 through the drain electrode D of the driving transistor T1, the drain electrode connection portion 102d and the connection electrode 70. Due to a voltage difference formed between the anode 51 and the cathode 53, an electric field is formed between the anode 51 and the cathode 53, and the light-emitting material layer 52 emits light under the action of the electric field.

For example, as illustrated in FIG. 1A and FIG. 1B, the silicon-based display substrate further includes an encapsulation layer 60 on the light-emitting device 50 and a color filter 70 on the encapsulation layer 60. The encapsulation layer 60 can encapsulate and protect the light-emitting device 50, and can also play a planarization role, so as to provide a flat surface. For example, the light-emitting device 50 of each sub-pixel may emit white light, and in this case, the color of the color filter 70 on the light-emitting device 50 of each sub-pixel is different, such as red, green, blue, etc., to achieve full color display; alternatively, the light-emitting device 50 of each sub-pixel may emit light of different colors, such as red, green and blue, etc., and in this case, the color of the color filter 70 on the light-emitting device 50 of each sub-pixel is the same as the color of the light emitted by the light-emitting device 50, so that the color purity of the light emitted by the light-emitting device 50 can be improved.

The inventor(s) of the present disclosure found during research that in the above-mentioned display substrate, due to the high sub-pixel density (e.g., greater than 3000 PPI) and the small spacing between adjacent sub-pixels, the light-emitting material layers 52 of a plurality of light-emitting devices 50 are usually continuously arranged, and a functional layer with higher carrier mobility usually exists in the light-emitting material layer 52, which is easy to cause lateral electrical crosstalk between sub-pixels. For example, when a blue sub-pixel is turned on, a red sub-pixel and a green sub-pixel will also have light colors exposed, resulting in color mixing, which reduces the color gamut of the display device, thereby affecting the display effect of the display substrate.

At least one embodiment of the present disclosure provides a display substrate, and the display substrate includes a plurality of sub-pixels arranged in an array, and includes a driving circuit substrate, a plurality of first electrodes, a pixel definition layer, and a light-emitting material layer. The driving circuit substrate includes a plurality of pixel driving circuits for the plurality of sub-pixels and a protective insulating layer covering the plurality of pixel driving circuits, the protective insulating layer includes a plurality of first vias exposing output terminals of the plurality of pixel driving circuits, and the plurality of first electrodes are on the driving circuit substrate, and respectively electrically connected to the output terminals of the plurality of pixel driving circuits through the plurality of first vias. The pixel definition layer is at least on a side of the plurality of first electrodes away from the driving circuit substrate, and includes a plurality of sub-pixel openings respectively exposing the plurality of first electrodes and includes at least one partition structure on the pixel definition layer. The light-emitting material layer is on a side of the pixel definition layer away from the driving circuit substrate and at least in the plurality of sub-pixel openings. The pixel definition layer includes a first pixel definition sub-layer and a second pixel definition sub-layer that are stacked, the second pixel definition sub-layer is on a side of the first pixel definition sub-layer away from the driving circuit substrate, and a width of the second pixel definition sub-layer is greater than a width of the first pixel definition sub-layer.

In the above-mentioned display substrate provided by at least one embodiment of the present disclosure, the light-emitting material layers of the light-emitting devices of adjacent sub-pixels are disconnected at the position of the partition structure, so the problem of lateral electrical crosstalk will not occur between adjacent sub-pixels. Therefore, the phenomenon of color mixing between adjacent sub-pixels is avoided, and the display effect of the display substrate can be improved.

Hereinafter, the display substrate provided by the embodiments of the present disclosure will be described in detail through several specific embodiments.

Figure 2:
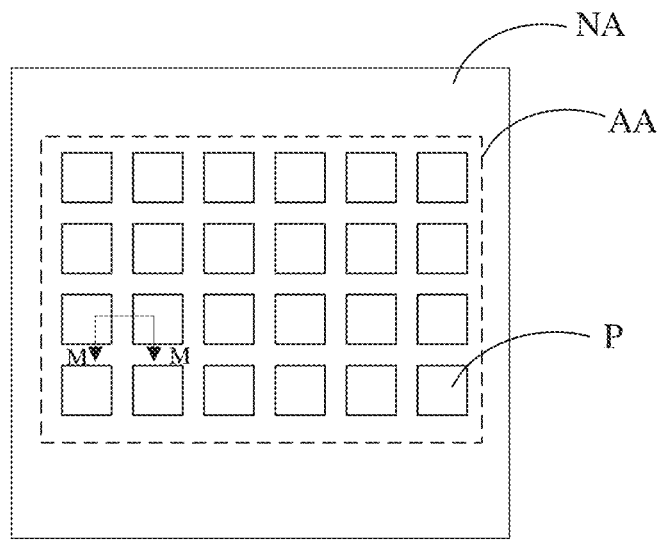
FIG. 2 is a schematic plan view of a display substrate provided by at least one embodiment of the present disclosure.
Figure 3:
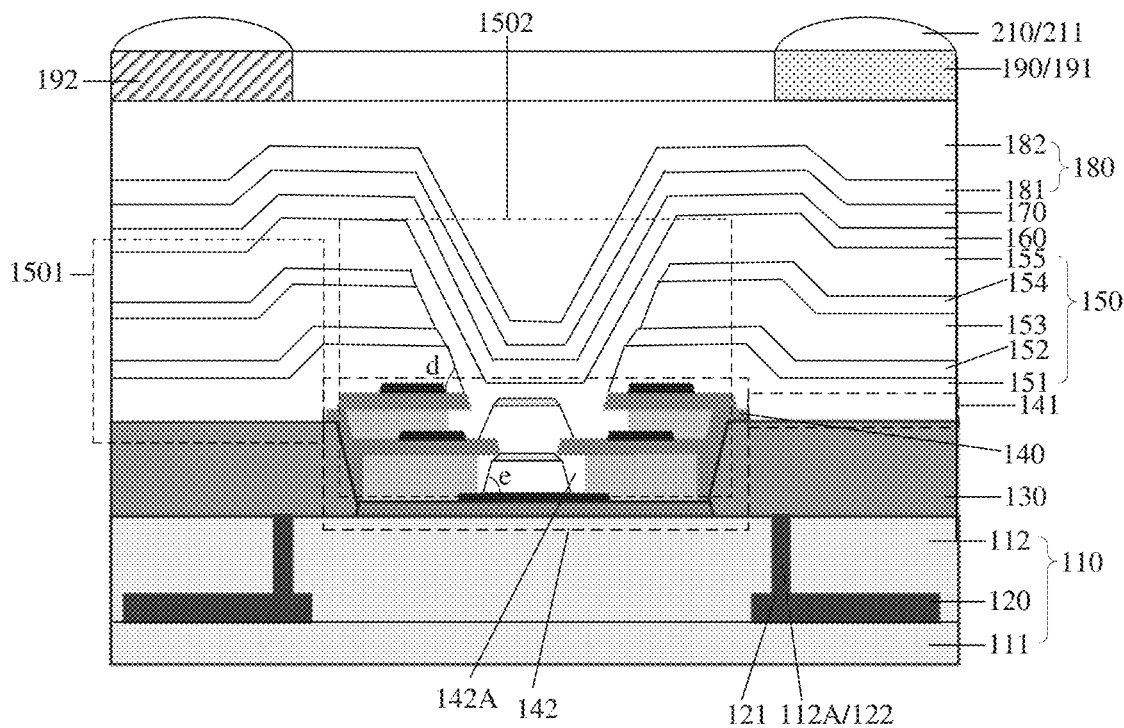
FIG. 3 is a schematic cross-sectional view of the display substrate in FIG. 2 along a line M-M.

At least one embodiment of the present disclosure provides a display substrate, FIG. 2 illustrates a schematic plan view of the display substrate, and FIG. 3 illustrates a schematic cross-sectional view of the display substrate in FIG. 2 along a line M-M.

For example, as illustrated in FIG. 2 and FIG. 3, the display substrate includes a display region AA and a peripheral region NA surrounding the display region AA, the display substrate further includes a plurality of sub-pixels P arranged in an array, and the plurality of sub-pixels P are in the display region AA. Each sub-pixel P includes a pixel driving circuit and a light-emitting device, and the pixel driving circuit is configured to drive the light-emitting device to implement display. For example, the light-emitting device may be an all-fluorescent light-emitting device, an all-phosphorescent light-emitting device, or a hybrid light-emitting device combining fluorescent light-emitting and phosphorescent light-emitting, the embodiments of the present disclosure are not limited in this aspect.

For example, as illustrated in FIG. 3, the display substrate includes structures such as a driving circuit substrate 110, a plurality of first electrodes 130, a pixel definition layer 140, a light-emitting material layer, and the like. The driving circuit substrate 110 includes a plurality of pixel driving circuits 120 for the plurality of sub-pixels P, and a protective insulating layer 112 covering the plurality of pixel driving circuits 120. The protective insulating layer 112 includes a plurality of first vias 112A exposing output terminals 121 of the plurality of pixel driving circuits 120, and the plurality of first electrodes 130 are on the driving circuit substrate 110, and respectively electrically connected to the output terminals 121 of the plurality of pixel driving circuits 120 through the plurality of first vias 112A.

For example, as illustrated in FIG. 3, the pixel driving circuit 120 may include structures such as a driving transistor, a connection electrode, and the like. For details, please refer to FIG. 1B and related descriptions thereof, which will not be repeated here. The light-emitting device includes an anode, a cathode, and a light-emitting material layer between the anode and the cathode, and the first electrode 130 is, for example, implemented as the anode of the light-emitting device. For example, a connection electrode 122 is formed in the first via 112A, and the first electrode 130 is connected to the pixel driving circuit 120 through the connection electrode 122. For example, the connection electrodes 122 may be made of a metal material such as tungsten, copper, titanium, aluminum or molybdenum or an alloy material.

For example, as illustrated in FIG. 3, the pixel definition layer 140 is at least on the side of the plurality of first electrodes 130 away from the driving circuit substrate, and includes a plurality of sub-pixel openings 141 respectively exposing the plurality of first electrodes 130 to define a light-emitting region of each sub-pixel P. For example, the pixel definition layer 140 further includes at least one partition structure 142 on the pixel definition layer 140.

For example, in some examples, the partition structure 142 may be provided on the first electrode 130, in some examples, the partition structure 142 may be provided between adjacent first electrodes 130, and in some examples, the at least one partition structure 142 includes a plurality of partition structures 142, some of the partition structures 142 are on the first electrode 130, and some of the partition structures 142 are between adjacent first electrodes 130. For example, in the example illustrated in FIG. 3, the partition structure 142 is between adjacent first electrodes 130.

For example, as illustrated in FIG. 3, the light-emitting material layer 150 is on the side of the pixel definition layer 140 away from the driving circuit substrate 110 and at least in the plurality of sub-pixel openings 141. For example, at least part of the light-emitting material layer 150 is disconnected at the position of the partition structure 142.

For example, in some examples, all of the light-emitting material layer 150 is disconnected at the position of the partition structure 142, or, in some examples, at least a functional layer with higher carrier mobility (e.g., a hole injection layer or a charge generation layer, which will be described in detail later) in the light-emitting material layer 150 is disconnected at the position of the partition structure 142. Therefore, the problem of lateral electrical crosstalk will not occur between adjacent sub-pixels in the display substrate, so that the display brightness and display contrast of the display substrate can be improved, thereby improving the display effect of the display substrate.

For example, in the embodiments of the present disclosure, the partition structure 142 may have various forms, so as to achieve the above-mentioned effect of disconnecting at least part of the light-emitting material layer 150. For example, FIG. 4A-FIG. 24 exemplarily illustrate schematic diagrams of various structures of the partition structure 142, which can be used to partition, for example, the light-emitting material layer 150 including different functional layers.

For example, as illustrated in FIG. 4A-FIG. 24, a sidewall of each partition structure 142 includes a first notch 142A, thereby helping at least part of the light-emitting material layer 150 to be disconnected at the position of the partition structure 142.

Figure 4A:
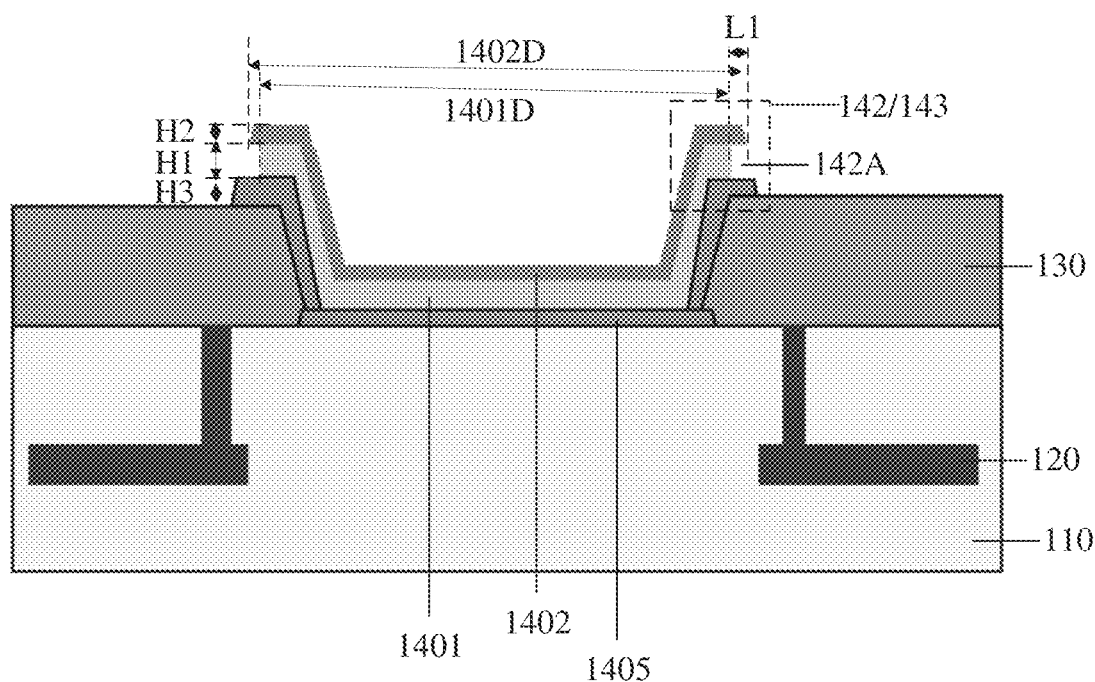
FIG. 4A-FIG. 24 are schematic diagrams of various structures of a partition structure in a display substrate provided by at least one embodiment of the present disclosure.
Figure 4B:
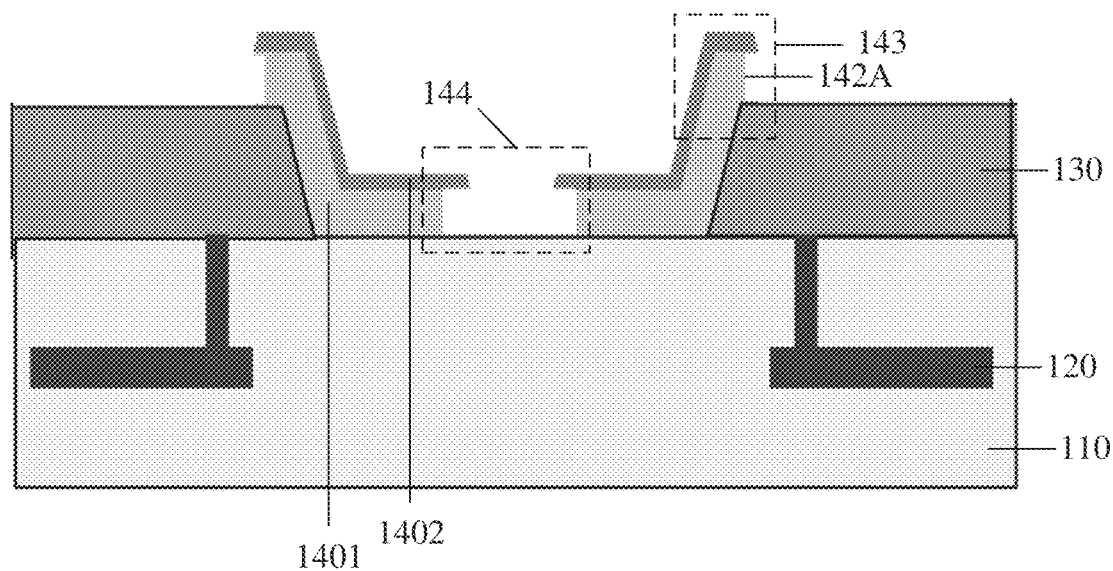

For example, in some embodiments, as illustrated in FIG. 4A and FIG. 4B, the pixel definition layer 140 includes a first pixel definition sub-layer 1401 and a second pixel definition sub-layer 1402 that are stacked, and the second pixel definition sub-layer 1402 is on the side of the first pixel definition sub-layer 1401 away from the driving circuit substrate 110. For example, the width 1402D of the second pixel definition sub-layer 1402 is greater than the width 1401D of the first pixel definition sub-layer 1401, so that a structure similar to a half of a Chinese character "⊥" shape is formed at the position of the partition structure 142.

For example, the thickness of the light-emitting material layer 150 is greater than the thickness of the first pixel definition sub-layer 1401 and greater than the thickness of the second pixel definition sub-layer 1402.

For example, in some examples, as illustrated in FIG. 4A and FIG. 4B, at the position of the partition structure 142, the first pixel definition sub-layer 1401 is inwardly shrunk relative to the second pixel definition sub-layer 1402 to form the first notch 142A.

For example, in some embodiments, the protective insulating layer 112, at the position of the partition structure 142 and regions except the first vias 112A, is a flat structure, so as to facilitate the formation and structural stability of the partition structure 142.

For example, in some embodiments, the width 1402D of the second pixel definition sub-layer 1402 is smaller than the width between two adjacent first electrodes 130, for example, the edges of the second pixel definition sub-layer 1402 cover the edges of the adjacent first electrodes 130.

For example, as illustrated in FIG. 4A, the pixel definition layer 140 may further include a pixel definition sub-layer 1405, and the first pixel definition sub-layer 1401 is on the side of the pixel definition sub-layer 1405 away from the driving circuit substrate 110. For example, the first pixel definition sub-layer 1401 is also inwardly shrunk relative to the pixel definition sub-layer 1405, thereby forming the first notch 142A.

For example, in some embodiments, the light-emitting material layer 150 includes a stack of a plurality of functional layers, for example, including a light-emitting layer and a plurality of auxiliary light-emitting layers that assist the light-emitting layer to emit light, and the thickness of the light-emitting material layer 150 may range from 50 nm to 500 nm, such as 200 nm, 300 nm, 400 nm, or the like.

Figure 26:
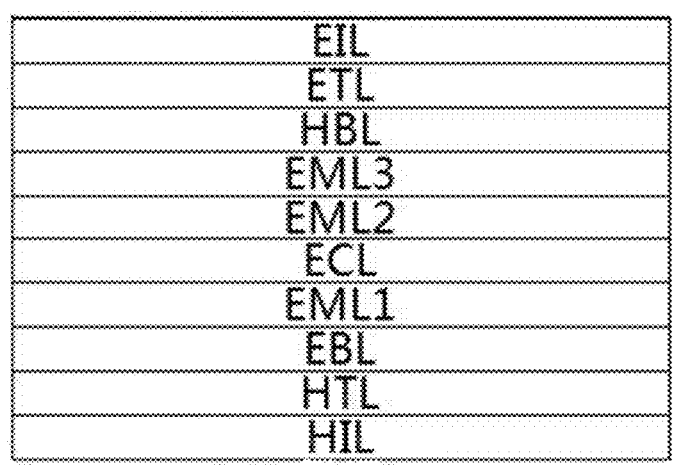

For example, in some examples, as illustrated in FIG. 26, the light-emitting material layer 150 includes a hole injection layer HIL, a hole transport layer HTL, an electron blocking layer EBL, a first light-emitting layer EML1, an exciton control layer ECL, a second light-emitting layer EML2, a third light-emitting layer EML3, a hole blocking layer HBL, an electron transport layer ETL, and an electron injection layer EIL that are stacked in sequence. Alternatively, in the case where the light-emitting material layer 150 includes at least part of the above-mentioned functional layers, the partition structure 142 may adopt the structure illustrated in FIG. 4A, and for the convenience of description, the above-mentioned light-emitting material layer 150 is referred to as a first light-emitting material layer.

For example, in some embodiments, the first pixel definition sub-layer 1401 may include an inorganic insulating material, such as silicon oxide, silicon nitride, silicon oxynitride, or the like. The second pixel definition sub-layer 1402 may include an inorganic insulating material or a metal oxide material, the inorganic insulating material includes silicon oxide, silicon nitride, silicon oxynitride, or the like, and the metal oxide material includes titanium oxide, aluminum oxide ($Al_2O_3$), or the like. The pixel definition sub-layer 1405 may include an inorganic insulating material or a metal oxide material, the inorganic insulating material includes silicon oxide, silicon nitride, silicon oxynitride, or the like, and the metal oxide material includes titanium oxide, aluminum oxide ($Al_2O_3$), or the like. For example, in some embodiments, the thickness of the pixel definition sub-layer 1405 may range from 5 nm to 50 nm, the thickness of the first pixel definition sub-layer 1401 may be range from 3 nm to 500 nm, and the thickness of the second pixel definition sub-layer 1402 may range from 0.5 nm to 100 nm.

In the embodiments of the present disclosure, in the case where the second pixel definition sub-layer 1402 is made of a metal oxide material, because the metal oxide can have higher etching accuracy, for example, the etching rate and the etching degree of the metal oxide can be easily controlled during the manufacturing process, so it is easy to form the desired structure.

For example, in the example of FIG. 4A, in the case where the partition structure 142 is used to partition the first light-emitting material layer, the second pixel definition sub-layer 1402, the first pixel definition sub-layer 1401 and the pixel definition sub-layer 1405 may be made of silicon oxide, silicon nitride and silicon oxide, respectively, or may be made of aluminum oxide ($Al_2O_3$), silicon nitride and silicon oxide, respectively. For example, the sum of the thicknesses of the second pixel definition sub-layer 1402 and the first pixel definition sub-layer 1401 is greater than or equal to 10 nm and less than or equal to 30 nm. For example, in some examples, the thicknesses H2 of the second pixel definition sub-layer 1402, the thicknesses H1 of the first pixel definition sub-layer 1401, and the thicknesses H3 of the pixel definition sub-layer 1405 are 10 nm, 10 nm, and 2 nm, respectively, or 10 nm, 10 nm, and 5 nm, respectively. The first pixel definition sub-layer 1401 is inwardly shrunk relative to the second pixel definition sub-layer 1402 by a distance L1, and the distance L1 ranges from 10 nm to 100 nm, for example, 50 nm.

For example, in other embodiments, the thickness H1 of the first pixel definition sub-layer 1401 may be greater than the thickness H2 of the second pixel definition sub-layer 1402, so as to facilitate partitioning the light-emitting material layer 150 having a larger thickness.

For example, in some examples, as illustrated in FIG. 27, the light-emitting material layer 150 may include a hole injection layer HIL, a hole transport layer HTL, an electron blocking layer EBL, a first light-emitting layer EML1, a second light-emitting layer EML2, an electron transport layer ETL, an N-type charge generation layer N-CGL, a P-type charge generation layer P-CGL, a hole transport layer HTL, an electron blocking layer EBL, a third light-emitting layer EML3, an electron transport layer ETL and an electron injection layer EIL that are stacked in sequence. Alternatively, in the case where the light-emitting material layer 150 includes at least part of the above-mentioned functional layers (for example, including an N-type charge generation layer and a P-type charge generation layer), the partition structure 142 may also adopt the structure illustrated in FIG. 4A, and for the convenience of description, the above-mentioned light-emitting material layer 150 is referred to as a second light-emitting material layer.

For example, in the example of FIG. 4A, in the case where the partition structure 142 is used to partition the second light-emitting material layer, the second pixel definition sub-layer 1402, the first pixel definition sub-layer 1401 and the pixel definition sub-layer 1405 may be made of silicon oxide, silicon nitride and silicon oxide, respectively, or may be made of aluminum oxide ($Al_2O_3$), silicon nitride and silicon oxide, respectively. For example, the sum of the thicknesses of the second pixel definition sub-layer 1402 and the first pixel definition sub-layer 1401 is greater than or equal to 10 nm and less than or equal to 100 nm. For example, the thicknesses H2 of the second pixel definition sub-layer 1402, the thicknesses H1 of the first pixel definition sub-layer 1401, and the thicknesses H3 of the pixel definition sub-layer 1405 are 20 nm, 60 nm, and 20 nm, respectively. The first pixel definition sub-layer 1401 is inwardly shrunk relative to the second pixel definition sub-layer 1402 by a distance L1, and the distance L1 ranges from 50 nm to 200 nm, for example, 100 nm or 150 nm.

For example, in some embodiments, as illustrated in FIG. 4A, the at least one partition structure 142 includes a plurality of first partition structures 143, the plurality of first partition structures 143 respectively surround the plurality of sub-pixel openings 141, and the first notches 142A of the plurality of first partition structures 143 respectively face the plurality of sub-pixel openings 141.

Figure 5:
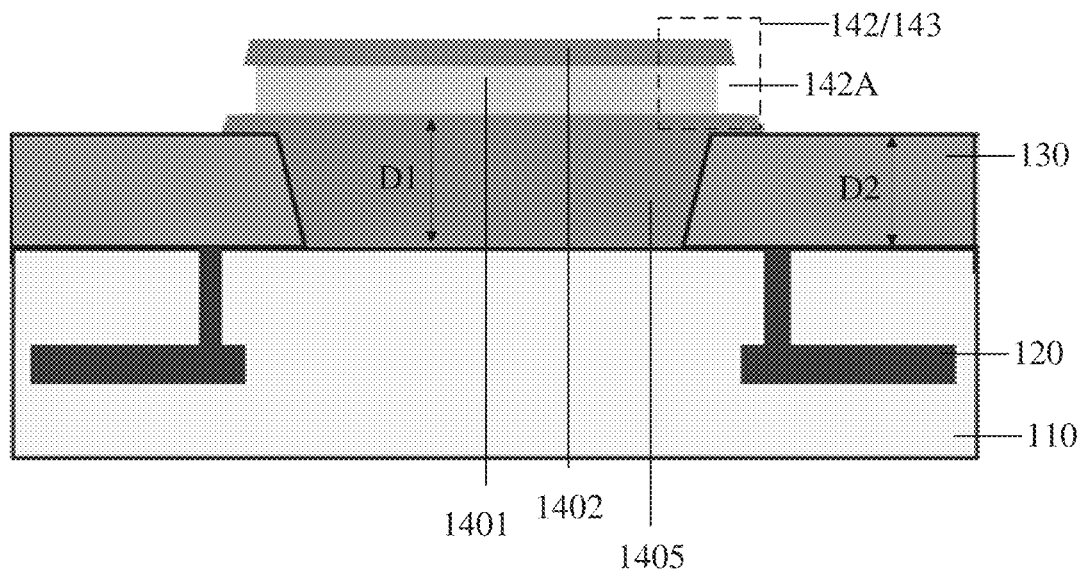

For example, FIG. 5 illustrates another schematic diagram of the first partition structure 143. As illustrated in FIG. 5, in some embodiments, the distance H1 between the surface of the first pixel definition sub-layer 1401 close to the driving circuit substrate 110 and the driving circuit substrate 110 is greater than the distance H2 between the surfaces of the plurality of first electrodes 130 away from the driving circuit substrate 110 and the driving circuit substrate 110. For example, in this example, the pixel definition sub-layer 1405 has a larger thickness, so that the region between adjacent first electrodes 130 can be planarized to increase the distance between the first partition structure 143 and the driving circuit substrate 110.

For example, as illustrated in FIG. 5, the pixel definition sub-layer 1405 has a height D1, which may range from 80 nm to 150 nm, such as 100 nm, so as to planarize the region between the adjacent first electrodes 130.

For example, the partition structure 142 illustrated in FIG. 5 may also be used to partition the above-mentioned first light-emitting material layer and second light-emitting material layer, and the thickness of the first pixel definition sub-layer 1401, the thickness of the second pixel definition sub-layer 1402, the inwardly shrunk distance, and the like may also be referred to the above-mentioned embodiments, which are not repeated here.

Figure 6:
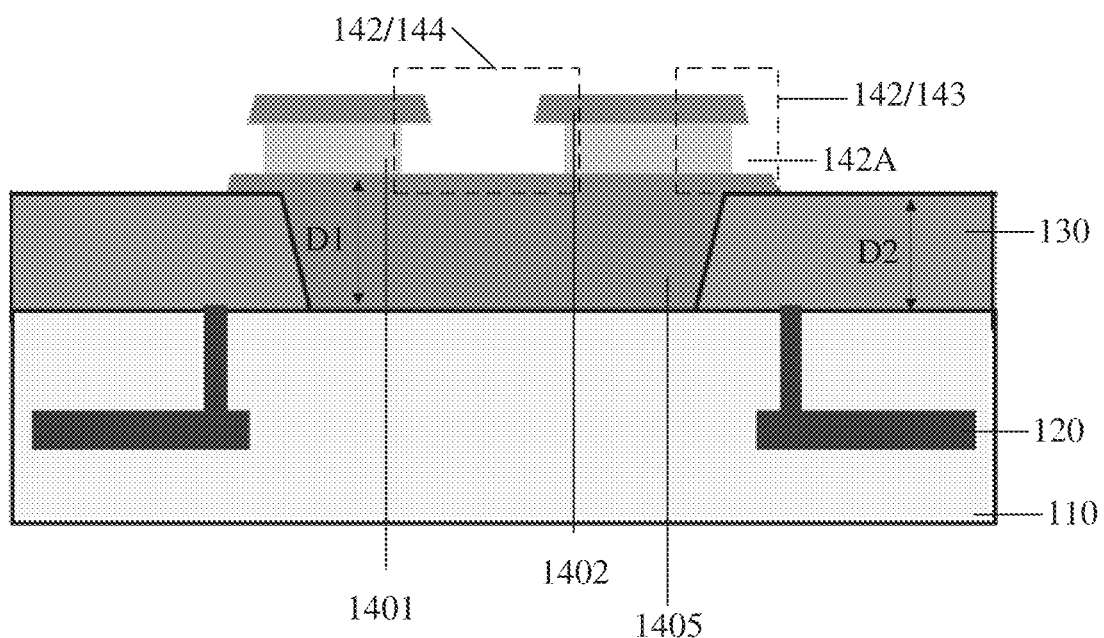

For example, FIG. 6 illustrates another schematic diagram of the partition structure 142. As illustrated in FIG. 6. in some embodiments, the at least one partition structure 142 further includes a plurality of second partition structures 144, and the plurality of second partition structures 144 are respectively arranged between two adjacent first partition structures 143 in the plurality of first partition structures 143. For example, the second partition structure 144 is in an inverted cut shape. For example, in the second partition structure 144, the distance of the first pixel definition sub-layer 1401 inwardly shrunk relative to the second pixel definition sub-layer 1402 may be equal to, greater than, or smaller than the distance, in the first partition structure 143, of the first pixel definition sub-layer 1401 inwardly shrunk relative to the second pixel definition sub-layer 1402. The second partition structure 144 can enhance the partition effect of the partition structure 142.

Figure 7:
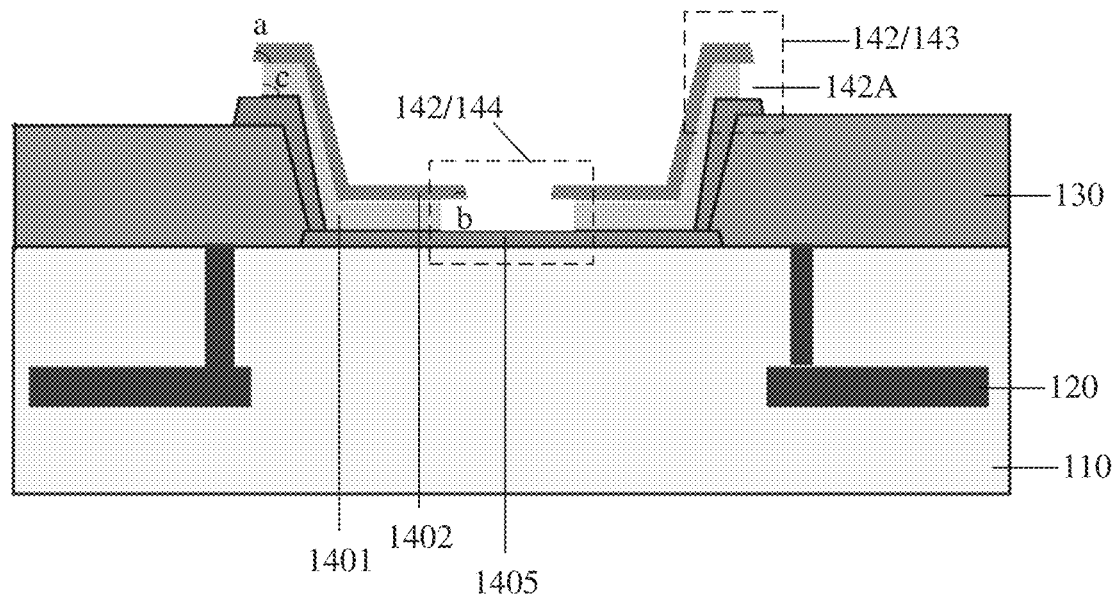

For example, in some embodiments, as illustrated in FIG. 6, the distance between the plurality of first partition structures 143 and the driving circuit substrate 110 is equal to the distance between the plurality of second partition structures 144 and the driving circuit substrate 110, that is, the first partition structure 143 and the second partition structure 144 are at substantially the same height; or, in other embodiments, as illustrated in FIG. 7, the distance between the plurality of first partition structures 143 and the driving circuit substrate 110 is greater than the distance between the plurality of second partition structures 144 and the driving circuit substrate 110. For example, the second partition structure 144 is provided between adjacent first electrodes 130, and the first partition structure 143 is on the side of the first electrode 130 away from the driving circuit substrate 110, which is illustrated above the first electrode 130 in the figure.

For example, in some embodiments, as illustrated in FIG. 7, the second pixel definition layer 1402 has a first slope angle a at sidewalls of the plurality of first partition structures 143, and the first slope angle a may range from 30° to 75°, such as 40°, 50°, 60°, or the like; the second pixel definition layer 1402 has a second slope angle b at sidewalls of the plurality of second partition structures 144, and the second slope angle b may range from 30° to 80°, such as 45°, 55°, 65°, or the like.

For example, in some embodiments, as illustrated in FIG. 7, a slope angle c of the first pixel definition sub-layer 1401 at the sidewalls of the plurality of first partition structures 143 is greater than the slope angle a of the second pixel definition sub-layer 1402 at the sidewalls of the plurality of first partition structures 143.

For example, referring to FIG. 3, the light-emitting material layer 150 is disconnected at the first notch 142A, the light-emitting material layer 150 includes a first portion 1501 for emitting light and a second portion 1502 not used for emitting light, the light-emitting material layer 150 is disconnected at the position of the second portion 1502, and a slope angle d of the first portion 1501 is greater than a slope angle e of the second portion 1502 at the disconnected position.

For example, referring to FIG. 4A, a depth L1 of the first notch 142A in a direction parallel to a surface of the base substrate 110 is greater than a thickness H1 of the first pixel definition sub-layer 1401 and a thickness H2 of the second pixel definition sub-layer 1402 in a direction perpendicular to the surface of the base substrate 110. Therefore, the partition structure 142 can fully implement the partition function at the first notch 142A.

Figure 10:
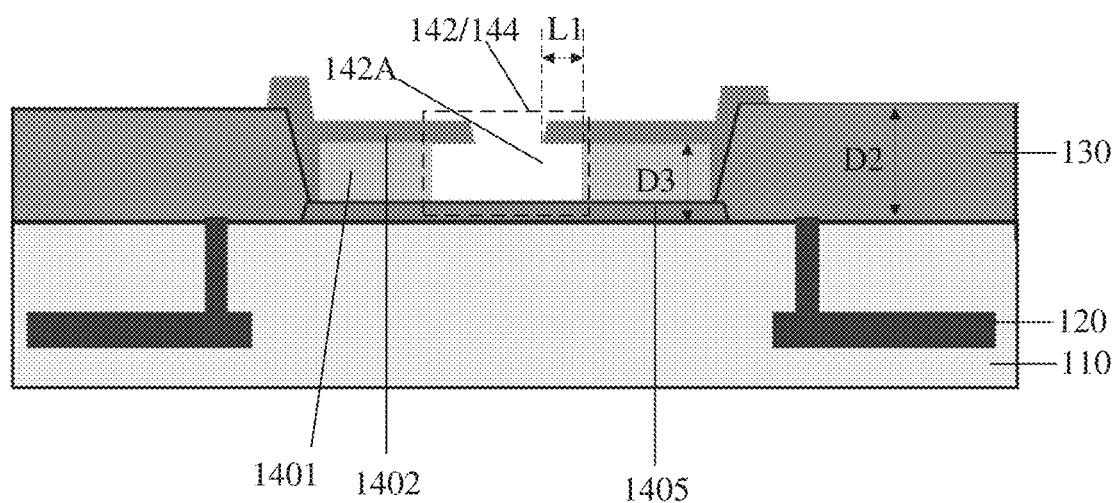
Figure 30:
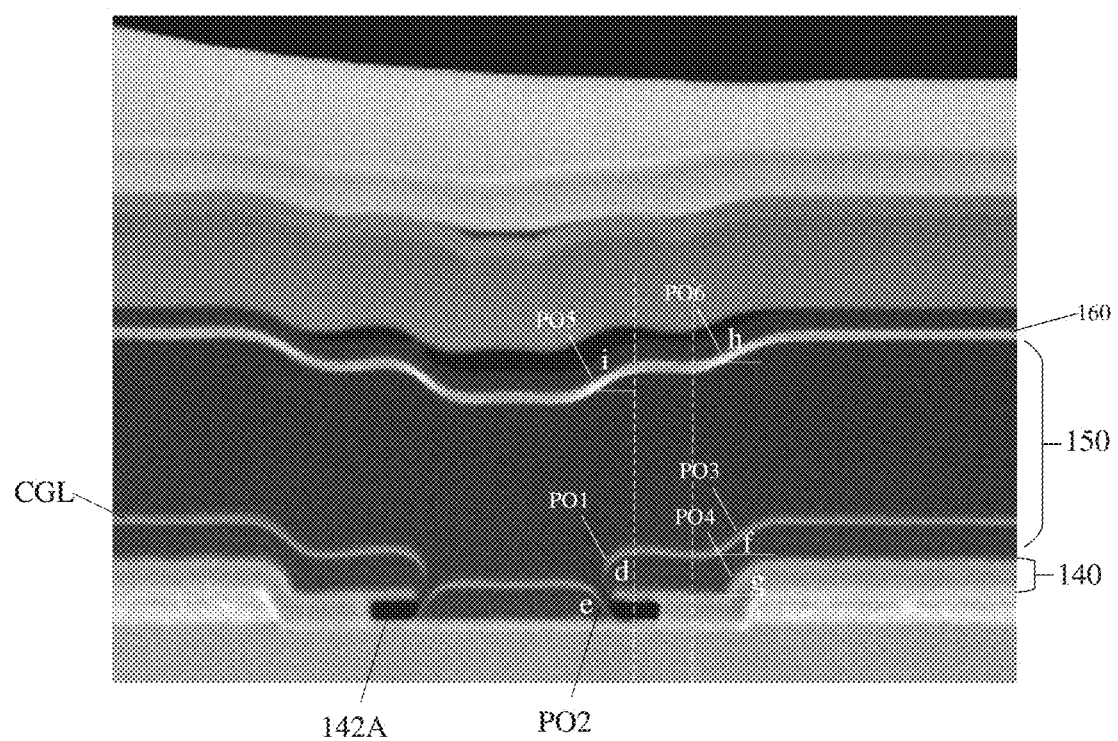
FIG. 30 is a partial cross-sectional view of a display substrate provided by at least one embodiment of the present disclosure.

For example, in some embodiments, FIG. 30 illustrates a scanning electron microscope image of the display substrate in this example. As illustrated in FIG. 10, the light-emitting material layer 150 is disconnected at the first notch 142A, the first portion of the light-emitting material layer 150 for emitting light has a first slope portion PO1 at the disconnected position, the slope angle of the first slope portion PO1 is d, the second portion of the light-emitting material layer 150 not used for emitting light has a second slope portion PO2 at the disconnected position, and the slope angle of the second slope portion PO2 is e.

For example, the light-emitting material layer 150 includes a charge generation layer CGL, and the charge generation layer CGL is disconnected at the first notch 142A. For example, the light-emitting material layer 150 further includes a third slope portion PO3 (marked at the charge generation layer CGL for clarity of illustration) away from the disconnected position, and the slope angle f of the third slope portion PO3 is smaller than the slope angle d of the first portion close to the disconnected position, and is smaller than the slope angle e of the second portion close to the disconnected position.

For example, the pixel definition layer includes a fourth slope portion PO4 at a position corresponding to the third slope portion PO3, and the slope angle g of the fourth slope portion PO4 is greater than the slope angle f of the third slope portion PO3. For example, the slope angle g of the fourth slope portion PO4 is smaller than the slope angle d of the first portion close to the disconnected position. For example, the slope angle g of the fourth slope portion PO4 is smaller than the slope angle e of the second portion at the disconnected position.

Figure 8:
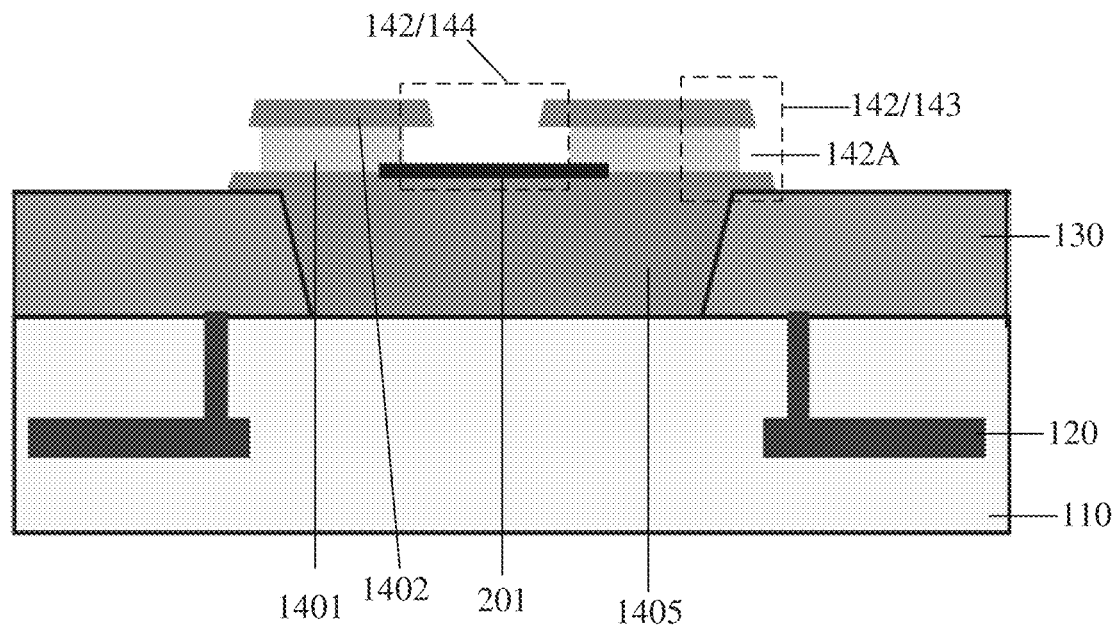
Figure 9:
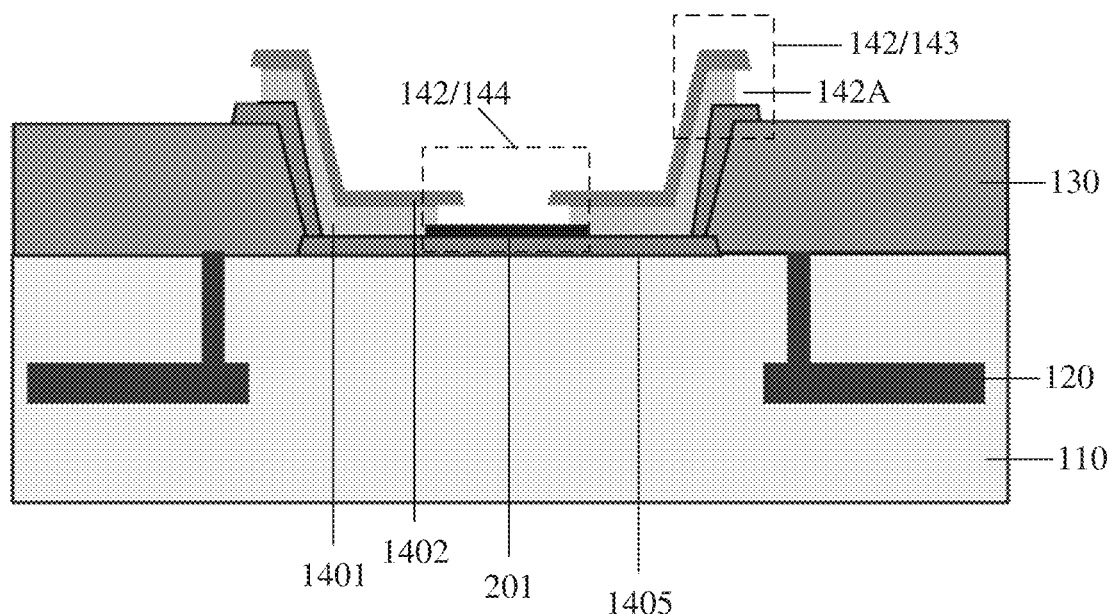

For example, in some embodiments, as illustrated in FIG. 8 and FIG. 9, the display substrate may further include a first auxiliary electrode layer 201 on a side of the first pixel definition sub-layer 1401 close to the driving circuit substrate 110 and exposed by the plurality of second partition structures 144. The first auxiliary electrode layer 201 can shield the electric field interference that may be generated between adjacent first electrodes 130 or between the first electrode 130 and other circuits in the display substrate, thereby improving the display effect of the display substrate. For example, in the manufacturing process of the display substrate, the first auxiliary electrode layer 201 can also be served as an etch barrier layer for blocking the functional layer under the first auxiliary electrode layer 201 from being etched by an etchant when the partition structure 142 is formed by etching.

For example, the first pixel definition sub-layer 1401 covers the edge of the first auxiliary electrode layer 201. For example, the width W3 (refer to FIG. 16) of the first auxiliary electrode layer 201 is larger than a depth L1 of the first notch 142A in the direction parallel to the surface of the base substrate 110. Therefore, the first auxiliary electrode layer 201 can fully implement the functions of preventing electric field interference and etching blocking.

For example, the partition structures 142 illustrated in FIG. 6-FIG. 9 can also be used to partition the above-mentioned first light-emitting material layer and second light-emitting material layer, and the thickness of the first pixel definition sub-layer 1401, the thickness of the second pixel definition sub-layer 1402, the inwardly shrunk distance, and the like may also be referred to the above-mentioned embodiments, which are not repeated here.

For example, in some embodiments, as illustrated in FIG. 10, the partition structure 142 may also only include the second partition structure 144, for example, include a plurality of second partition structures 144, and the plurality of second partition structures 144 are respectively arranged between the plurality of first electrodes 130.

For example, as illustrated in FIG. 10, the distance D3 between the surface of the first pixel definition sub-layer 1401 away from the driving circuit substrate 110 and the driving circuit substrate 110 is smaller than the distance D2 between the surfaces of the plurality of first electrodes 130 away from the driving circuit substrate 110 and the driving circuit substrate 110. For example, in some examples, the thicknesses H2 of the second pixel definition sub-layer 1402, the thicknesses H1 of the first pixel definition sub-layer 1401, and the thicknesses H3 of the pixel definition sub-layer 1405 are 20 nm, 70 nm, and 10 nm, respectively, or 20 nm, 60 nm, and 20 nm, respectively.

For example, as illustrated in FIG. 10, the distance L1 of the first pixel definition sub-layer 1401 inwardly shrunk relative to the second pixel definition sub-layer 1402 may range from 10 nm to 200 nm, such as from 50 nm to 200 nm, such as 150 nm, or the like.

Figure 11:
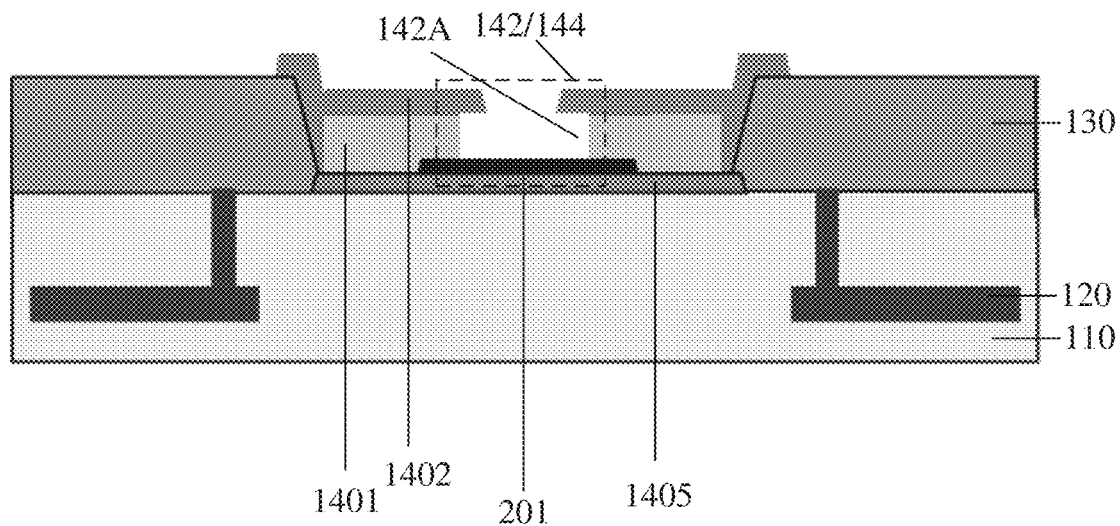

For example, in some embodiments, as illustrated in FIG. 11, the display substrate may further include a first auxiliary electrode layer 201 on a side of the first pixel definition sub-layer 1401 close to the driving circuit substrate 110 and exposed by the plurality of second partition structures 144.

Figure 12:
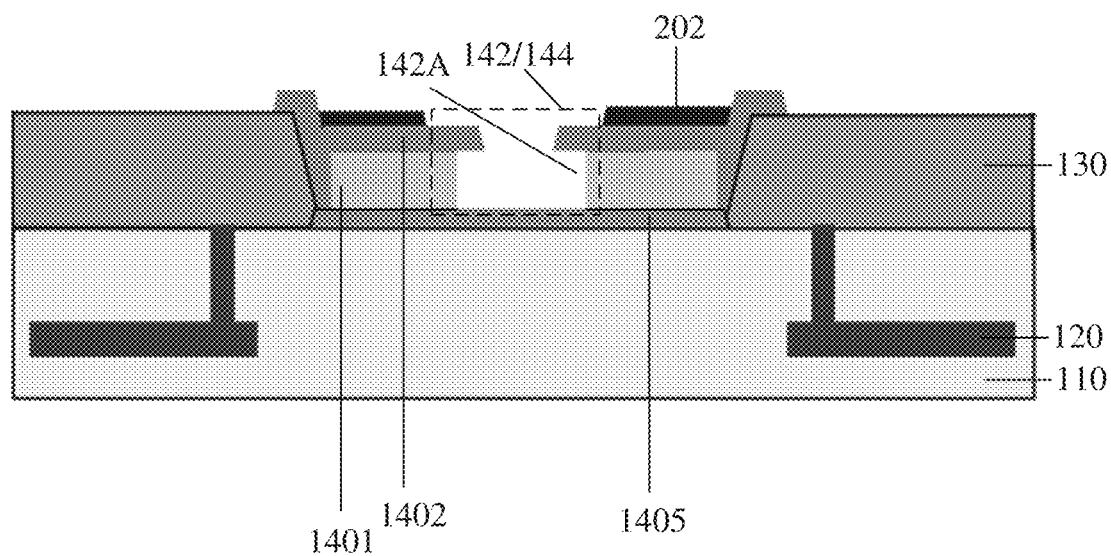

For example, in some embodiments, as illustrated in FIG. 12, the display substrate may further include a second auxiliary electrode layer 202 on a side of the second pixel definition sub-layer 1402 away from the driving circuit substrate 110.

For example, in some embodiments, the display substrate may include both the first auxiliary electrode layer 201 on the side of the first pixel definition sub-layer 1401 close to the driving circuit substrate 110 and exposed by the plurality of second partition structures 144 and the second auxiliary electrode layer 202 on the side of the second pixel definition sub-layer 1402 away from the driving circuit substrate 110.

In the embodiments of the present disclosure, at least one auxiliary electrode layer may be provided at different positions of the partition structure 142 to shield the electric field interference that may be generated between the adjacent first electrodes 130 or between the first electrode 130 and other circuits in the display substrate, thereby improving the display effect of the display substrate.

For example, the partition structures 142 illustrated in FIG. 10-FIG. 12 can also be used to partition the above-mentioned first light-emitting material layer and second light-emitting material layer, and the thickness of the first pixel definition sub-layer 1401, the thickness of the second pixel definition sub-layer 1402, the inwardly shrunk distance, and the like may also be referred to the description of FIG. 10, which are not repeated here.

Figure 13:
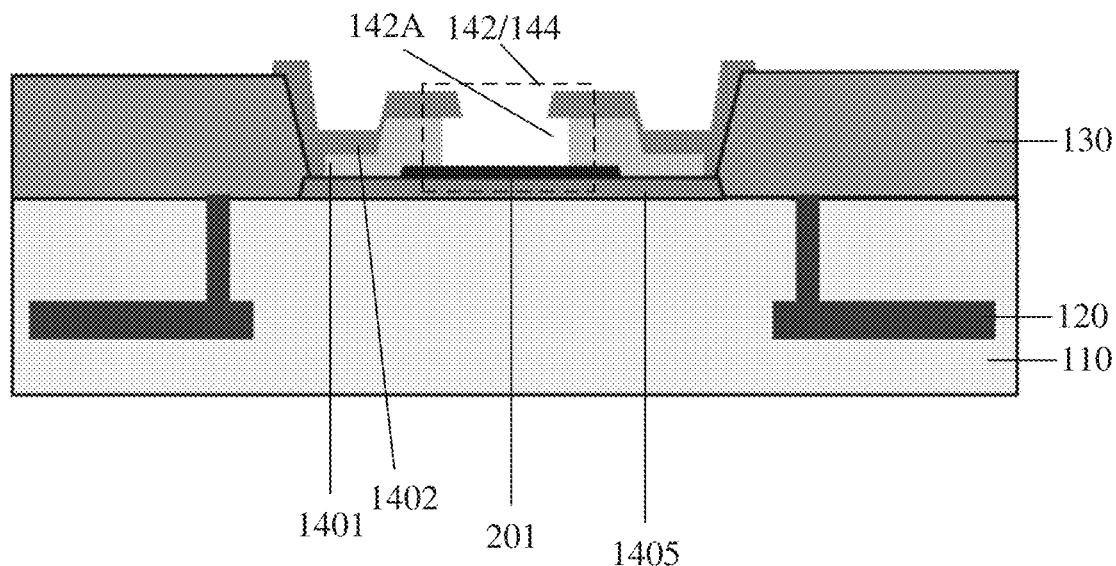

For example, in some embodiments, the partition structure 142/the second partition structure 144 may have a structure as illustrated in FIG. 13. For example, in the example of FIG. 13, the second pixel definition sub-layer 1402 and the first pixel definition sub-layer 1401 respectively include a corresponding convex portion at the position of the first auxiliary electrode layer 201, in this example, the thicknesses H2 of the second pixel definition sub-layer 1402, the thicknesses H1 of the first pixel definition sub-layer 1401, and the thicknesses H3 of the pixel definition sub-layer 1405 may be 20 nm, 60 nm, and 20 nm, respectively. For example, the distance of the first pixel definition sub-layer 1401 inwardly shrunk relative to the second pixel definition sub-layer 1402 may range from 10 nm to 200 nm, such as from 50 nm to 200 nm, such as 150 nm, or the like. The thickness of the first auxiliary electrode layer 201 may be 20 nm.

Figure 14:
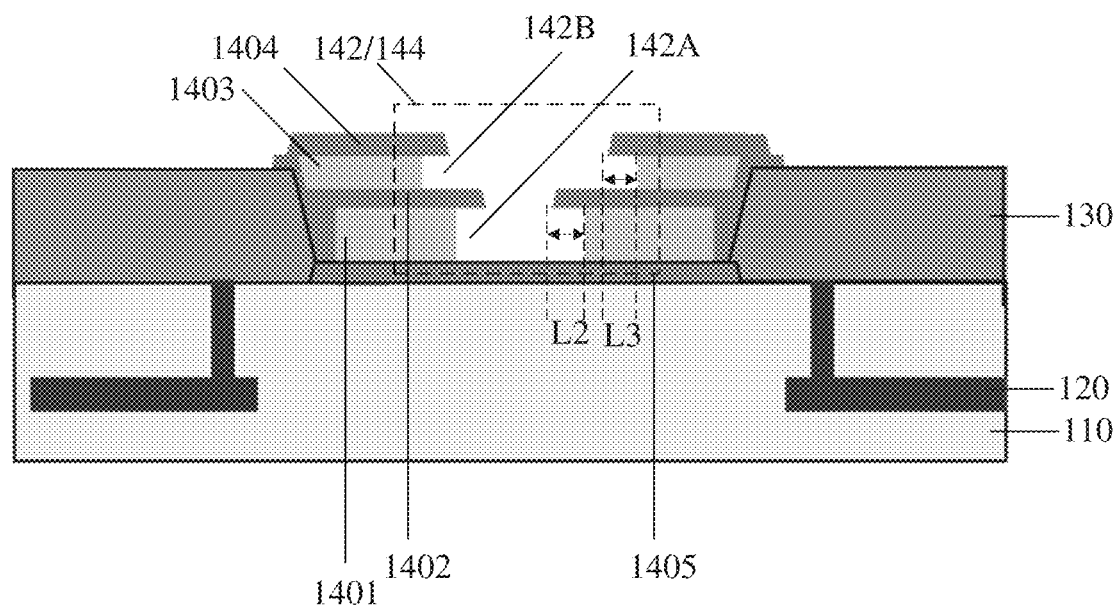

For example, in other embodiments, as illustrated in FIG. 14, in addition to the above-mentioned first notch 142A, the sidewall of each second partition structure 144 may further include a second notch 142B, and the second notch 142B is on a side of the first notch 142A away from the driving circuit substrate 110. The second partition structure 144 with the second notch 142B can partition the thicker light-emitting material layer 150 with more functional layers.

For example, as illustrated in FIG. 14, the pixel definition layer 140 further includes a third pixel definition sub-layer 1403 and a fourth pixel definition sub-layer 1404 that are stacked, the third pixel definition sub-layer 1403 is on a side of the second pixel definition sub-layer 1402 away from the driving circuit substrate 110, and the fourth pixel definition sub-layer 1404 is on a side of the third pixel definition sub-layer 1403 away from the driving circuit substrate 110. The third pixel definition sub-layer 1403 is inwardly shrunk relative to the fourth pixel definition sub-layer 1404 at positions of the plurality of second partition structures 144, so as to form the second notch 142B.

For example, the partition structure with the first notch 142A and the second notch 142B may be used to partition the light-emitting material layer 150 including more functional layers, and in this case, the light-emitting material layer 150 may include at least one charge generation layer (CGL).

For example, in some examples, as illustrated in FIG. 28, the light-emitting material layer 150 may include a hole injection layer HIL, a hole transport layer HTL, an electron blocking layer EBL, a first light-emitting layer EML1, an electron transport layer ETL, an N-type charge generation layer N-CGL, a P-type charge generation layer P-CGL, a hole transport layer HTL, an electron blocking layer EBL, a second light-emitting layer EML2, an electron transport layer ETL, an N-type charge generation layer N-CGL, a P-type charge generation layer P-CGL, a hole transport layer HTL, an electron blocking layer EBL, a third light-emitting layer EML3, an electron transport layer ETL, and an electron injection layer EIL that are stacked in sequence. Alternatively, in the case where the light-emitting material layer 150 includes at least part of the above-mentioned functional layers (for example, including two N-type charge generation layers and a P-type charge generation layer that are stacked), the partition structure 142 may adopt the structure with the first notch 142A and the second notch 142B illustrated in FIG. 14, and for the convenience of description, the above-mentioned light-emitting material layer 150 is referred to as a third light-emitting material layer.

For example, in some embodiments, the third pixel definition sub-layer 1403 may include an inorganic insulating material, such as silicon oxide, silicon nitride, silicon oxynitride, or the like. The fourth pixel definition sub-layer 1404 may include an inorganic insulating material or a metal oxide material, the inorganic insulating material includes silicon oxide, silicon nitride, silicon oxynitride, or the like, and the metal oxide material includes titanium oxide, aluminum oxide ($Al_2O_3$), or the like.

For example, in the example of FIG. 14, the sum of the thickness of the fourth pixel definition sub-layer 1404 and the thickness of the third pixel definition sub-layer 1403 is greater than or equal to 10 nm and less than or equal to 100 nm, and the sum of the thickness of the fourth pixel definition sub-layer 1404, the thickness of the third pixel definition sub-layer 1403, the thickness of the second pixel definition sub-layer 1402, and the thickness of the first pixel definition sub-layer 1401 is greater than or equal to 150 nm and less than or equal to 300 nm.

For example, in some examples, the fourth pixel definition sub-layer 1404, the third pixel definition sub-layer 1403, the second pixel definition sub-layer 1402, the first pixel definition sub-layer 1401, and the pixel definition sub-layer 1405 may be made of silicon oxide, silicon nitride, silicon oxide, silicon nitride and silicon oxide, respectively, or made of aluminum oxide ($Al_2O_3$), silicon nitride, aluminum oxide ($Al_2O_3$), silicon nitride and silicon oxide, respectively. For example, the thickness of the fourth pixel definition sub-layer 1404, the thickness of the third pixel definition sub-layer 1403, the thickness of the second pixel definition sub-layer 1402, the thickness of the first pixel definition sub-layer 1401, and the thickness of the pixel definition sub-layer 1405 may be 20 nm, 60 nm, 20 nm, 80 nm and 20 nm, respectively, or 20 nm, 70 nm, 20 nm, 50 nm and 20 nm, respectively. For example, the distance L2 of the third pixel definition sub-layer 1403 inwardly shrunk relative to the fourth pixel definition sub-layer 1404 may range from 50 nm to 200 nm, such as 150 nm, and the distance L3 of the first pixel definition sub-layer 1401 inwardly shrunk relative to the second pixel definition sub-layer 1402 may also range from 50 nm to 200 nm, such as 150 nm.

Figure 15:
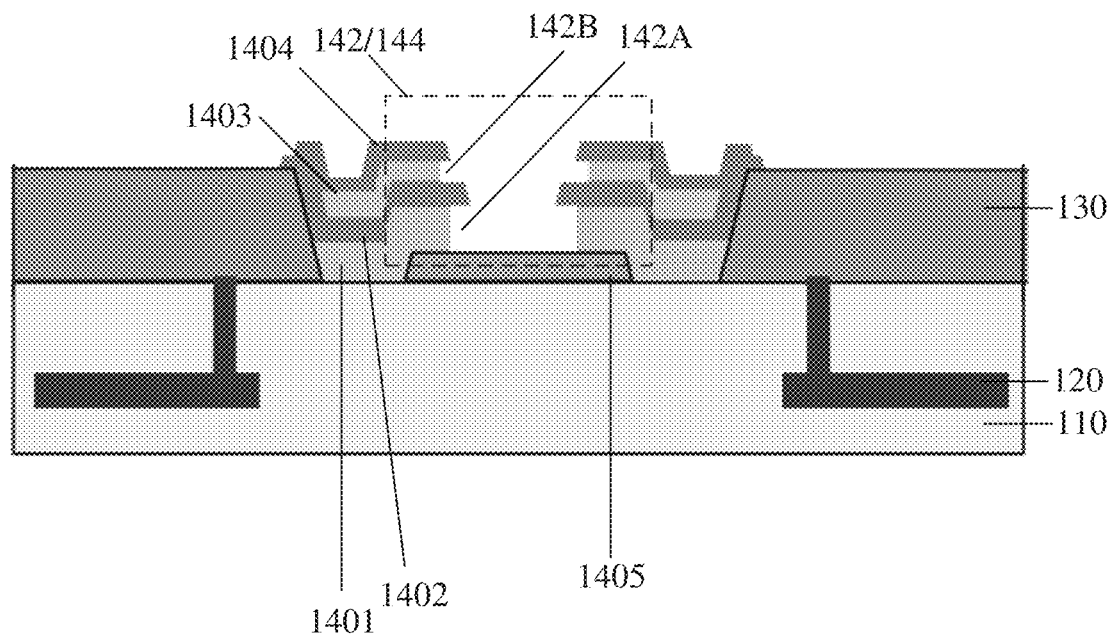

For example, in some embodiments, the second partition structure 144 may also have the structure illustrated in FIG. 15. Compared with the structure illustrated in FIG. 14, in FIG. 15, the pixel definition sub-layer 1405 has a smaller width, while the fourth pixel definition sub-layer 1404, the third pixel definition sub-layer 1403, the second pixel definition sub-layer 1402, and the first pixel definition sub-layer 1401 respectively include a corresponding convex portion at the pixel definition sub-layer 1405. In this case, the thickness of the fourth pixel definition sub-layer 1404, the thickness of the third pixel definition sub-layer 1403, the thickness of the second pixel definition sub-layer 1402, the thickness of the first pixel definition sub-layer 1401, and the thickness of the pixel definition sub-layer 1405 may be 20 nm, 60 nm, 20 nm, 80 nm and 20 nm, respectively, the distance L2 of the third pixel definition sub-layer 1403 inwardly shrunk relative to the fourth pixel definition sub-layer 1404 may range from 50 nm to 200 nm, such as 150 nm, and the distance L3 of the first pixel definition sub-layer 1401 inwardly shrunk relative to the second pixel definition sub-layer 1402 may also range from 50 nm to 200 nm, such as 150 nm.

Figure 16:
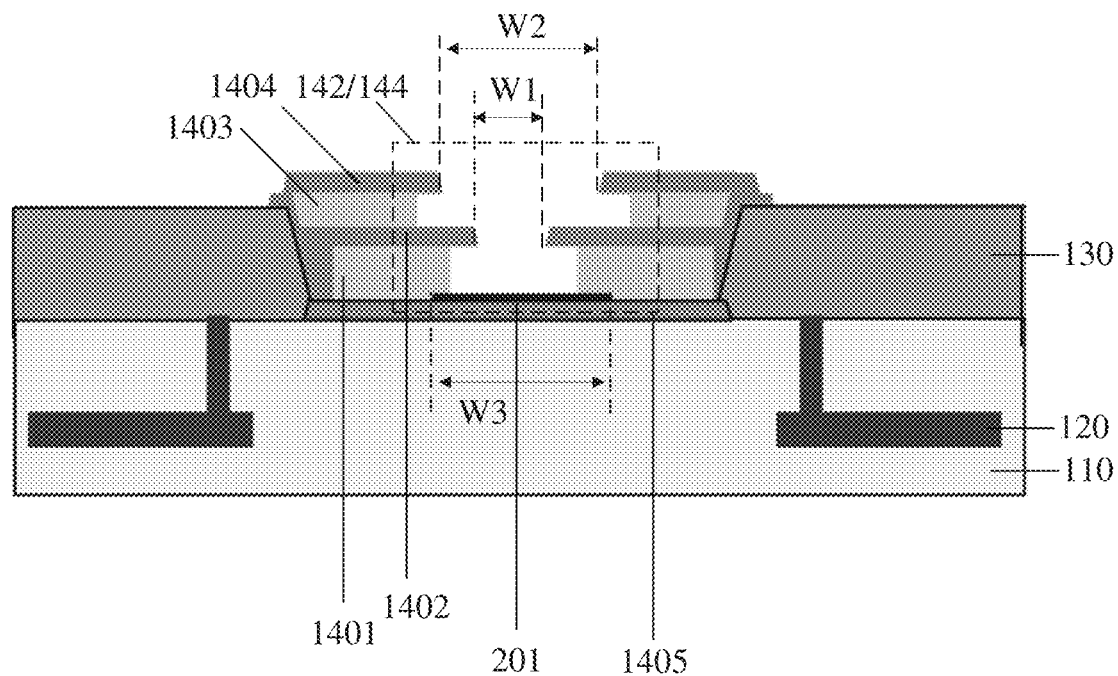

For example, in some embodiments, as illustrated in FIG. 16, the display substrate may further include a first auxiliary electrode layer 201 on a side of the first pixel definition sub-layer 1401 close to the driving circuit substrate 110 and exposed by the plurality of second partition structures 144.

Figure 17:
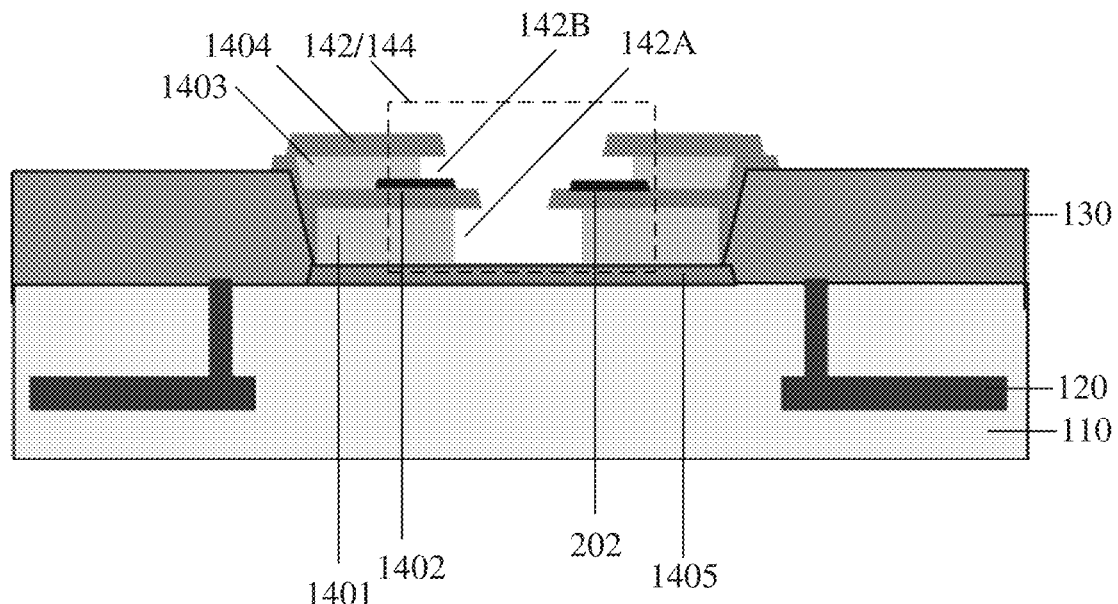
Figure 18:
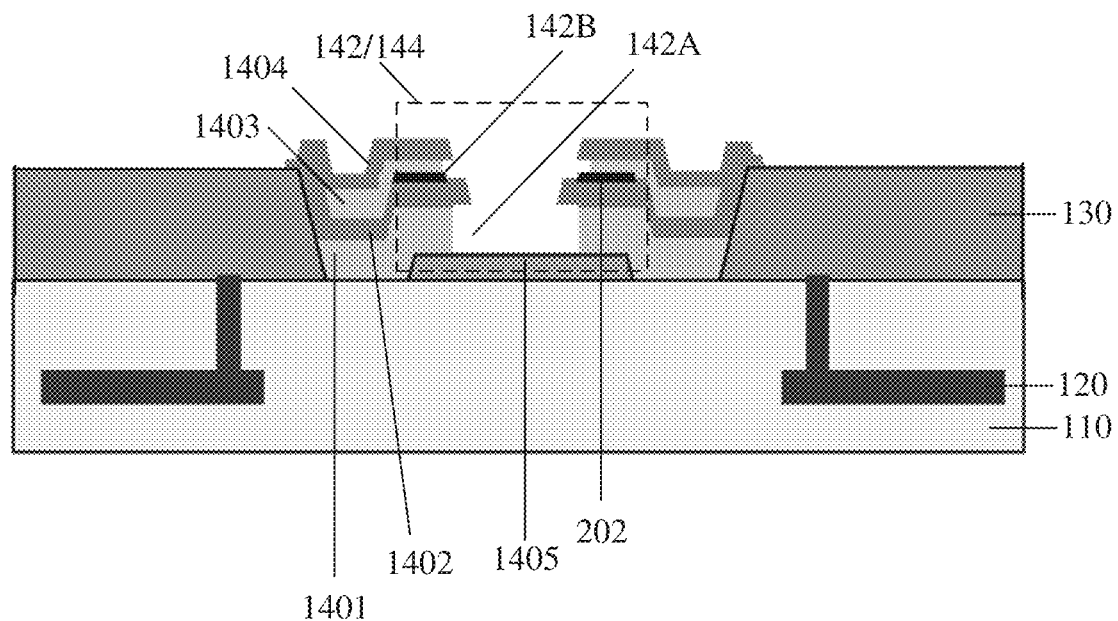

For example, as illustrated in FIG. 17 and FIG. 18, the display substrate may further include a second auxiliary electrode layer 202 on a side of the second pixel definition sub-layer 1402 away from the driving circuit substrate 110.

Figure 19:
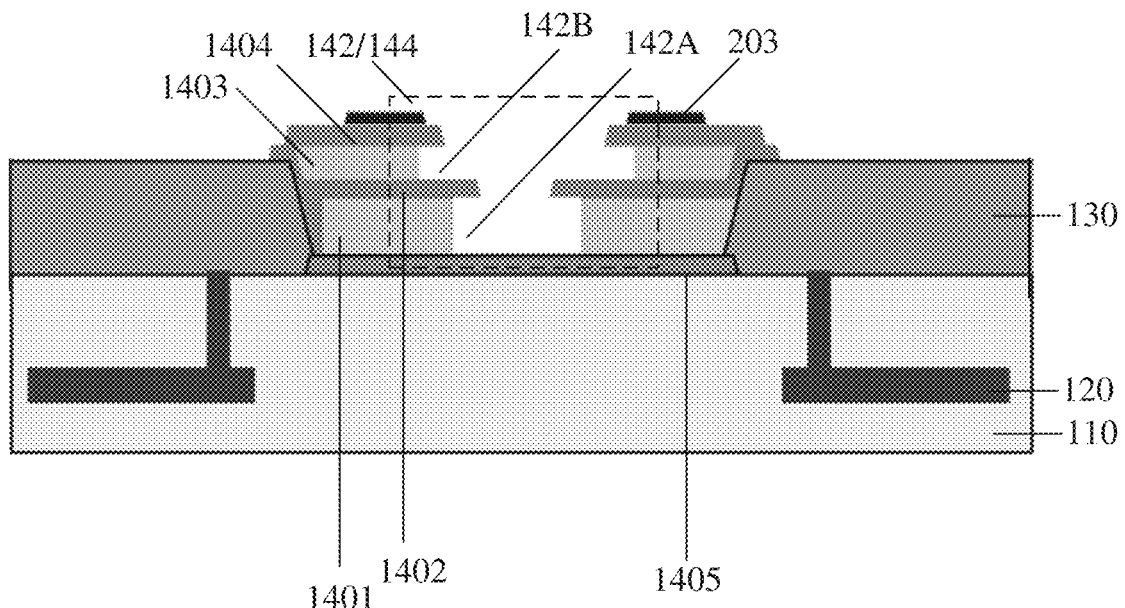
Figure 20:
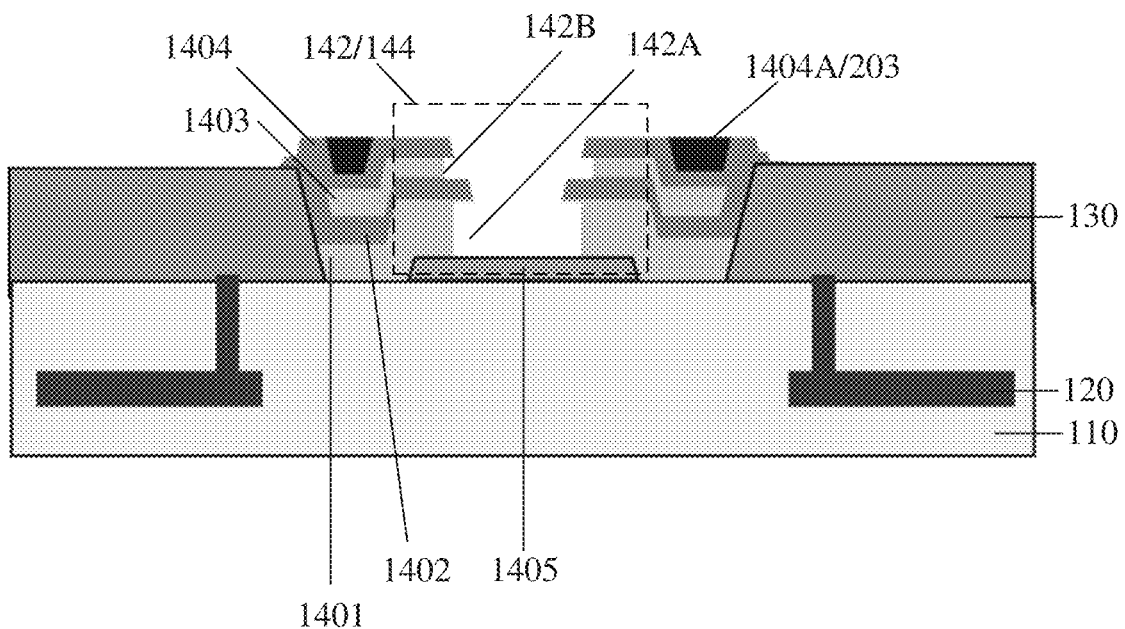

For example, as illustrated in FIG. 19 and FIG. 20, the display substrate may further include a third auxiliary electrode layer 203 on a side of the fourth pixel definition sub-layer 1404 away from the driving circuit substrate 110. For example, in the embodiment illustrated in FIG. 20, the fourth pixel definition sub-layer 1404 includes a recessed portion 1404A, the third auxiliary electrode layer 203 may be provided in the recessed portion 1404A, and the surface of the third auxiliary electrode layer 203 is flush with the surface of the fourth pixel definition sub-layer 1404, thereby reducing the overall thickness of the third auxiliary electrode layer 203 and the second partition structure 144.

Figure 21:
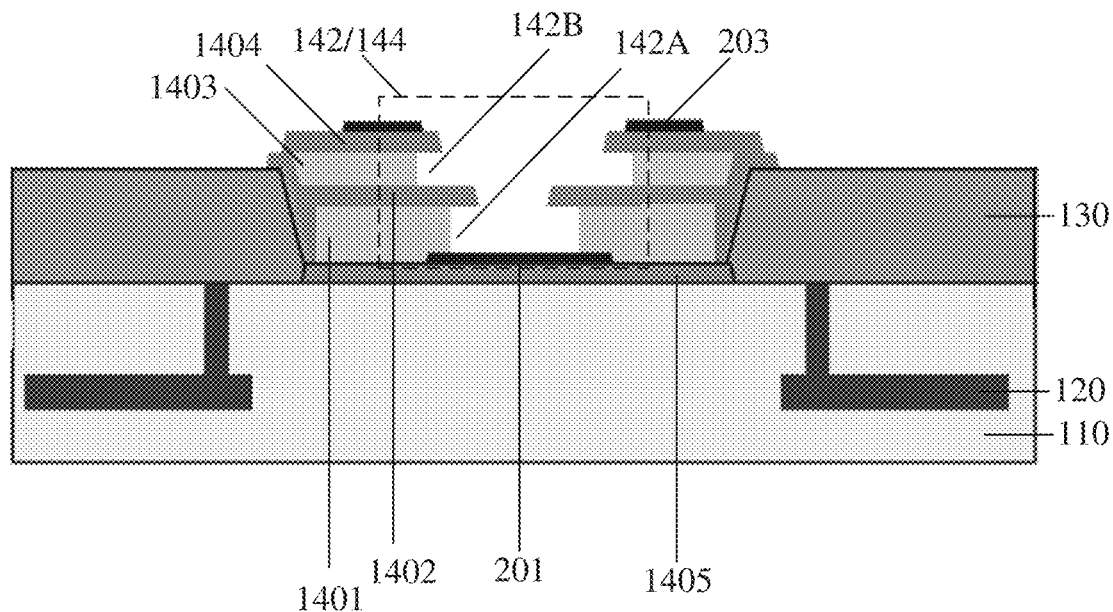
Figure 22:
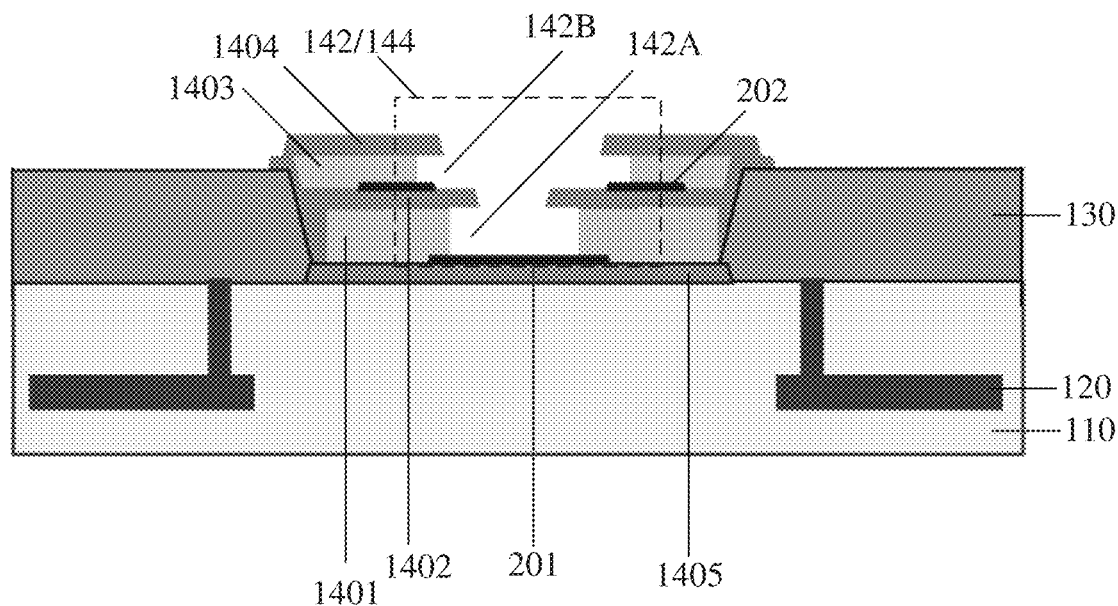
Figure 23:
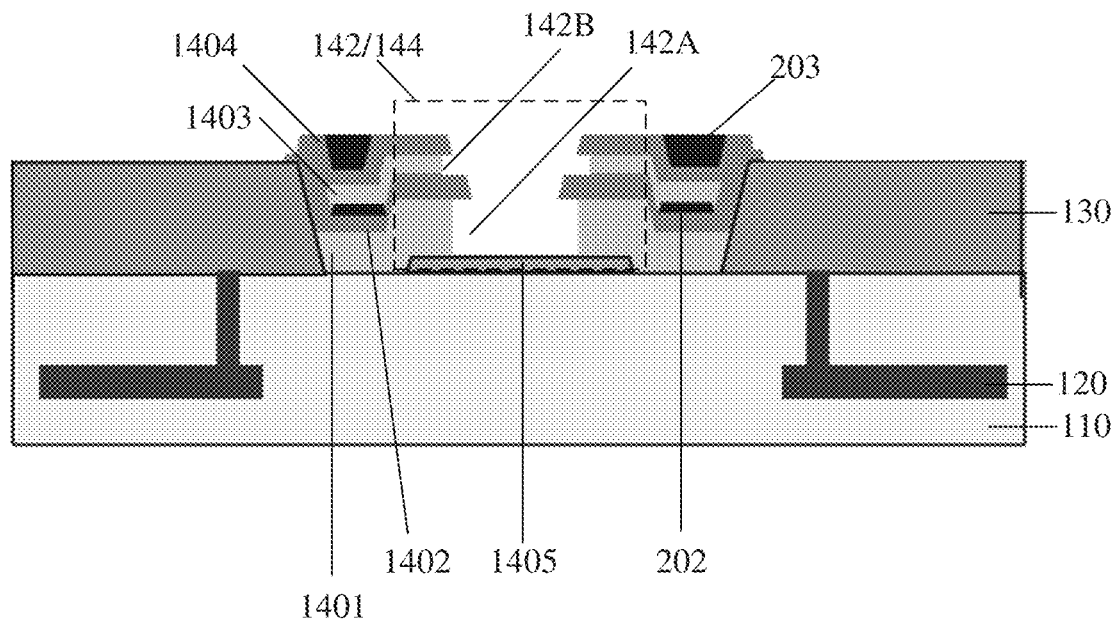
Figure 24:
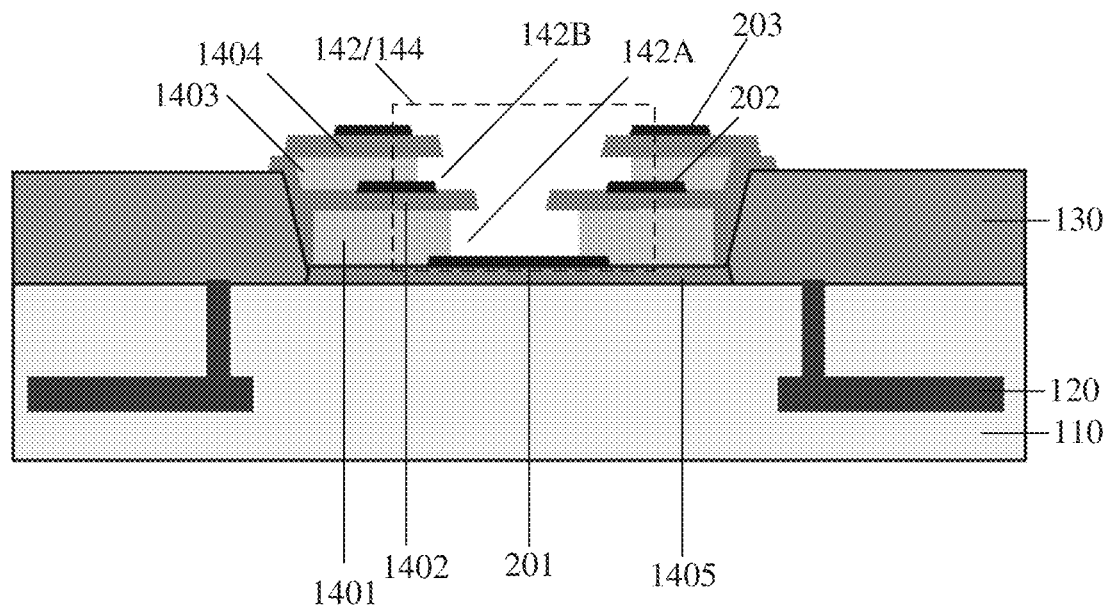

For example, in some embodiments, the display substrate may also include two or three of the first auxiliary electrode layer 201, the second auxiliary electrode layer 202 and the third auxiliary electrode layer 203. For example, FIG. 21 illustrates an example of a display substrate including both the first auxiliary electrode layer 201 and the third auxiliary electrode layer 203. FIG. 22 illustrates an example of a display substrate including both the first auxiliary electrode layer 201 and the second auxiliary electrode layer 202, FIG. 23 illustrates an example of a display substrate including both the second auxiliary electrode layer 202 and the third auxiliary electrode layer 203, and FIG. 24 illustrates an example of a display substrate including both the first auxiliary electrode layer 201, the second auxiliary electrode layer 202 and the third auxiliary electrode layer 203.

For example, the materials of the first auxiliary electrode layer 201 and/or the second auxiliary electrode layer 202 and/or the third auxiliary electrode layer 203 may include at least one selected from a group consisting of: Al, Ti, TiN, Ag, Mo, ITO and IZO. The materials of the first auxiliary electrode layer 201, the second auxiliary electrode layer 202 and the third auxiliary electrode layer 203 may be the same or different. For example, the thickness of the first auxiliary electrode layer 201 and/or the thickness of the second auxiliary electrode layer 202 and/or the thickness of the third auxiliary electrode layer 203 may range from 5 nm to 100 nm, such as 20 nm, 30 nm, 40 nm, 50 nm, or the like. The auxiliary electrode layer(s) with the above setting can have a better effect of preventing electric field interference.

For example, in some embodiments, as illustrated in FIG. 14-FIG. 24, in an embodiment including a first notch 142A and a second notch 142B, referring to FIG. 16, the second pixel definition sub-layer 1402 is disconnected by a first distance W1 at the position of the first notch 142A, the fourth pixel definition sub-layer 1404 is disconnected by a second distance W2 at the position of the second notch 142B, the second distance W2 is greater than the first distance W1, and the difference between the second distance W2 and the first distance W1 ranges from 100 nm to 500 nm, such as 150 nm, 250 nm, 350 nm, or the like. This helps the first notch 142A to disconnect a part of the light-emitting material layer, and the second notch 142B to disconnect another part of the light-emitting material layer.

For example, in the embodiments of the present disclosure, in the case where the display substrate further includes the first auxiliary electrode layer 201 on the side of the first pixel definition sub-layer 1401 close to the driving circuit substrate 110 and exposed by the plurality of second partition structures 144, referring to FIG. 16, the width W3 of the first auxiliary electrode layer 201 is greater than the first distance W1 to fully realize the effect of preventing electric field interference.

In the embodiments of the present disclosure, because functional layers such as the hole injection layer HIL, the charge generation layers N-CGL and P-CGL, and the like in the light-emitting material layer have higher carrier mobility, in the case where the light-emitting material layer 150 includes the structure illustrated in FIG. 26 or a similar structure, because the functional layers with higher carrier mobility are fewer and the overall thickness is smaller, the partition structure 142 with only the first notch 142A illustrated in FIG. 4A to FIG. 13 can be used to disconnect the functional layers with higher carrier mobility and avoid crosstalk between adjacent sub-pixels.

For example, in the case where the light-emitting material layer 150 includes the structure illustrated in FIG. 27 or a similar structure, because there are relatively more functional layers with higher carrier mobility and the overall thickness is relatively thick, in this case, the partition structure 142 with only the first notch 142A illustrated in FIG. 4A-FIG. 11 may be adopted, and the thicknesses of the first pixel definition sub-layer 1401 and the second pixel definition sub-layer 1402 constituting the first notch 142A need to be selected appropriately; alternatively, the partition structure 142 with the first notch 142A and the second notch 142B, as illustrated in FIG. 14-FIG. 25, may also be adopted, so as to implement the effect of disconnecting the functional layers with higher carrier mobility and avoiding crosstalk between adjacent sub-pixels.

For example, in the case where the light-emitting material layer 150 includes the structure illustrated in FIG. 28 or a similar structure, because there are relatively more functional layers with higher carrier mobility and the overall thickness is relatively thick, in this case, the partition structure 142 with the first notch 142A and the second notch 142B illustrated in FIG. 14-FIG. 25 may be adopted, so as to fully implement the effect of disconnecting the functional layers with higher carrier mobility and avoiding crosstalk between adjacent sub-pixels.

Of course, in some embodiments, the partition structure 142 illustrated in FIG. 4A-FIG. 11 with only the first notch 142A may also be used to partition the light-emitting material layer illustrated in FIG. 28, and the partition structure 142 illustrated in FIG. 14-FIG. 25 with the first notch 142A and the second notch 142B may also be used to partition the light-emitting material layer illustrated in FIG. 26, as long as the corresponding partitioning function can be implemented.

For example, the display substrate illustrated in FIG. 3 includes the partition structure illustrated in FIG. 24, in this case, the light-emitting material layer 150 includes, for example, the structure illustrated in FIG. 28 or a similar structure. For example, as illustrated in FIG. 3, the light-emitting material layer 150 includes a plurality of parts 151-155, the part 151 may include a hole injection layer HIL, a hole transport layer HTL, an electron blocking layer EBL, a first light-emitting layer EML1, and an electron transport layer ETL, the part 152 includes an N-type charge generation layer N-CGL and a P-type charge generation layer P-CGL, the part 153 may include a hole transport layer HTL, an electron blocking layer EBL, a second light-emitting layer EML2, and an electron transport layer ETL, the part 154 may include an N-type charge generation layer N-CGL and a P-type charge generation layer P-CGL, and the part 155 may include a hole transport layer HTL, an electron blocking layer EBL, a third light-emitting layer EML3, an electron transport layer ETL, and an electron injection layer EIL. In this case, the first notch 142A is used to partition the part 151 and the part 152, and the second notch 142B is used to partition the part 153 and the part 154. Because the part 155 does not include a functional layer with higher carrier mobility, so it may not be disconnected, as illustrated in FIG. 3; or, in other examples, the part 155 may also be disconnected by the partition structure 142, which is not limited in the embodiments of the present disclosure.

Figure 29:
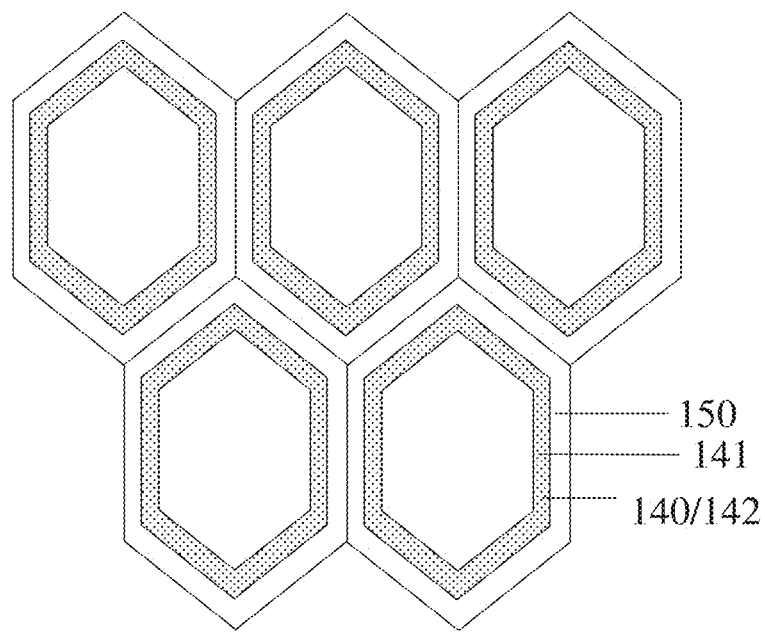
FIG. 29 is a schematic plan view of a plurality of sub-pixels in a display substrate provided by at least one embodiment of the present disclosure.

For example, FIG. 29 illustrates a schematic plan view of a plurality of sub-pixels in a display substrate. As illustrated in FIG. 29, in some embodiments, the sub-pixel opening 141 may be in a polygonal shape, such as a hexagon shape, and the partition structure 142 is provided around the sub-pixel opening 141. For example, the notch of the first partition structure 143 faces the sub-pixel opening 141, and the notch of the second partition structure 144 faces away from the sub-pixel opening 141. Both the first partition structure 143 and the second partition structure 144 can implement the effect of disconnecting the light-emitting material layer 150.

Figure 25:
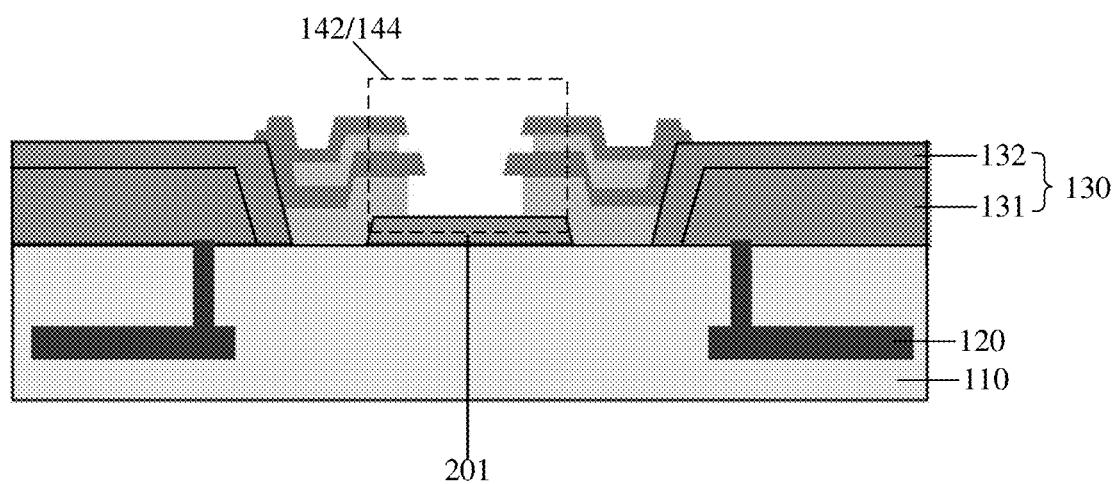
FIG. 25 is another schematic partial cross-sectional view of the display substrate in FIG. 2 along the line M-M.

For example, in some embodiments, as illustrated in FIG. 25, the first auxiliary electrode layer 201 may be provided in the same layer as at least part of the plurality of first electrodes 130 and spaced apart from the at least part of the plurality of first electrodes 130.

In the embodiments of the present disclosure, "provided in the same layer" means that two functional layers or structural layers are formed in the same layer and with the same material in the hierarchical structure of the display substrate, that is, in the manufacturing process, the two functional layers or structural layers can be formed from the same material layer, and the required patterns and structures can be formed through the same patterning process. Thereby, the manufacturing method of the display substrate can be simplified.

For example, as illustrated in FIG. 25, in some embodiments, the first electrode 130 may include a first sub-electrode layer 131 and a second sub-electrode layer 132 that are stacked. The first sub-electrode layer 131 may be served as a reflective electrode for reflecting the light emitted by the light-emitting material layer formed thereon, so as to improve the light-extraction rate of the light-emitting device. For example, the material of the first sub-electrode layer 131 may include a metal material or an alloy material with high reflectivity, such as titanium, molybdenum, aluminum, silver, or the like, and the thickness of the first sub-electrode layer 131 may range from 10 nm to 300 nm, such as 50 nm, 75 nm, 100 nm, or the like. For example, the second sub-electrode layer 132 has higher work function and light transmittance, the material of the second sub-electrode layer 132 may include a transparent metal oxide, such as indium tin oxide (ITO), indium zinc oxide (IZO), gallium zinc oxide (GZO), or the like, and the thickness of the second sub-electrode layer 132 may range from 10 nm to 300 nm, such as 20 nm, 50 nm, 100 nm, or the like. Thus, the light reflected by the first sub-electrode layer 131 can pass through the second sub-electrode layer 132 almost without loss, so as to improve the light-extraction efficiency and light-extraction brightness of the light-emitting device.

For example, in some examples, the first electrode 130 may also include more sub-electrode layers, such as an adhesive sub-electrode layer between the first sub-electrode layer 131 and the second sub-electrode layer 132, a connection sub-electrode layer between the first sub-electrode layer 131 and the driving circuit substrate 110, and the like (not illustrated in the figure). The adhesive sub-electrode layer may be made of a material that can enhance the adhesion between the first sub-electrode layer 131 and the second sub-electrode layer 132, such as TiN or the like, and the connection sub-electrode layer may be made of a material with low contact resistance, such as titanium or the like. The embodiments of the present disclosure do not limit the specific structure of the first electrode 130.

For example, in some examples, the first auxiliary electrode layer 201 may be in the same layer as the second sub-electrode layer 132 to simplify the manufacturing process of the display substrate.

In the embodiments of the present disclosure, the first auxiliary electrode layer 201 can provide an etching stop role when manufacturing the second partition structure 144, so as to avoid the phenomenon of over-etching when the second partition structure 144 is formed by etching; furthermore, the first auxiliary electrode layer 201 may also be electrically connected with other circuits to achieve the effects of leading out current and signal interference prevention.

For example, as illustrated in FIG. 3, the display substrate may further include a second electrode layer 160, and the second electrode layer 160 is on a side of the light-emitting material layer 150 away from the driving circuit substrate 110 and at least in the plurality of sub-pixel openings 141. For example, the second electrode layer 160 may serve as a cathode of the light-emitting device.

For example, in some examples, the second electrode layer 160 may be continuously arranged, so that the light-emitting devices of the plurality of sub-pixels on the display substrate may obtain substantially the same voltage from the second electrode layer 160. Alternatively, in other examples, the second electrode layer 160 may also be disconnected at the position of the partition structure 142. For example, the material of the second electrode layer 160 may be made of a metal material such as lithium, aluminum, magnesium, silver, or the like, an alloy material, or a metal oxide material such as IZO, or the like. For example, in one example, the second electrode layer 160 may include a stack of a Mg/Ag alloy layer and an IZO layer.

For example, as illustrated in FIG. 30, the second electrode layer 160 includes a fifth slope portion PO5 and a sixth slope portion PO6 respectively at the disconnected position corresponding to the first portion and the position of the third slope portion PO3. The slope angle i of the fifth slope portion PO5 is smaller than the slope angle d of the first portion at the disconnected position, and the slope angle h of the sixth slope portion PO6 is smaller than the slope angle f of the third slope portion PO3.

For example, the light-emitting material layer 150 is a flat structure between the first portion at the disconnected position (i.e., the position of the first slope portion PO1) and the third slope portion PO3, and the second electrode layer 160 is a flat structure between the fifth slope portion POS and the sixth slope portion PO6, for example, within the range illustrated by two dotted lines in FIG. 30.

For example, in some embodiments, as illustrated in FIG. 3, the display substrate may further include a light-extraction layer 170, the light-extraction layer 170 is on a side of the second electrode layer 160 away from the driving circuit substrate 110, and the refractive index of the light-extraction layer ranges from 1.3 to 1.7, such as 1.5, or the like. The light-extraction layer 170 can improve the light-extraction efficiency of the light-emitting device, thereby improving the display brightness of the display substrate, or having lower power consumption in the case where the display substrate has the same display brightness.

For example, in some embodiments, the material of the light-extraction layer 170 includes at least one selected from a group consisting of: LiF, SiOx, and $Al_2O_3$, and the thickness of the light-extraction layer may range from 10 nm to 200 nm, such as 30 nm, 50 nm, 100 nm, or the like.

For example, in some embodiments, as illustrated in FIG. 3, an encapsulation layer 180 may also be formed on the second electrode layer. For example, the encapsulation layer 180 may be a composite encapsulation layer in which an organic encapsulation layer 181 and an inorganic encapsulation layer 182 are stacked, the organic encapsulation layer 181 may be made of an organic material such as polyimide, resin, or the like, and the inorganic encapsulation layer 182 may be made of an inorganic material such as silicon oxide, silicon nitride, silicon oxynitride, or the like. For example, in some examples, the encapsulation layer 180 may further include a stack of more organic encapsulation layers and inorganic encapsulation layers 182, and FIG. 3 illustrates only one organic encapsulation layer 181 and one inorganic encapsulation layer 182 as an example, the embodiments of the present disclosure do not limit the specific form of the encapsulation layer 180.

For example, in some embodiments, as illustrated in FIG. 3, a color filter layer 190 may also be provided on the encapsulation layer 180, the color filter layer 190 includes a plurality of color filters, and two color filters 191 and 192 are illustrated in the figure as an example. For example, each color filter is respectively provided corresponding to the light-emitting region of the light-emitting device of the sub-pixel. For example, the plurality of color filters may transmit light of different colors, respectively. For example, in some examples, the light-emitting device of each sub-pixel may emit white light, and in this case, the colors of the color filters on the light-emitting devices of respective sub-pixels may be red, green, blue, etc., respectively, so as to implement full color display; or, the light-emitting device of each sub-pixel can emit light of different colors, respectively, such as red, green, blue, etc., in this case, the color of the color filter provided on the light-emitting device of each sub-pixel is the same as the light emitted by the light-emitting device, so that the color purity of the light emitted by the light-emitting device can be improved.

For example, the color filter may be at least one selected from a group consisting of: a resin material filter, a fluorescent dye filter, and a quantum dot filter, which is not limited in the embodiments of the present disclosure.

For example, in some embodiments, as illustrated in FIG. 3, a lens layer 210 may also be provided on the color filter layer 190, the lens layer 210 may be a continuous structure formed on the entire surface, or may include a plurality of lenses 211 corresponding to different sub-pixels (as illustrated in the figure), and the lens layer 210 is used to refract the light emitted by each sub-pixel, so that the light-emitting effect of the entire display substrate is more uniform. For example, in some examples, the lens 211 may be a convex lens. For example, the lens 211 may adopt a single-layer or multi-layer structure. In the case where the multi-layer structure is adopted, the refractive index of each layer in the lens 211 increases sequentially from the inside to the outside. The shape of the lens 211 may be spherical, cylindrical or prismatic. The embodiments of the present disclosure do not limit the specific form of the lens layer 210.

For example, in the embodiments of the present disclosure, as illustrated in FIG. 3, the driving circuit substrate 10 may be formed by using a silicon-based substrate 111 and using semiconductor manufacturing technology to form various functional layers on the silicon-based substrate 111. For example, the above-mentioned manufacturing process may be completed in a wafer factory. Therefore, the display substrate provided by the embodiments of the present disclosure can be formed by directly forming the first electrode 130, the pixel definition layer 140, the light-emitting material layer 150, and the second electrode layer 160 on the driving circuit substrate 10, and the manufacturing process is simple. In addition, because the manufacturing process of the silicon-based driving circuit substrate is mature and the performance is stable, it is suitable for manufacturing a highly integrated micro display device. Therefore, the display substrate provided by the embodiments of the present disclosure may be a silicon-based micro organic light-emitting diode display substrate, for example, the display substrate can be used in virtual reality (VR) display devices, augmented reality (AR) display devices, mobile phones, televisions and other display devices. In this case, the display device can have a higher resolution, such as a resolution greater than 500 PPI, such as a resolution greater than 3000 PPI. Alternatively, in some embodiments, the driving circuit substrate 10 may also be a glass substrate for glass-based high-resolution display products of different sizes, such as televisions, mobile phones, etc.

The following statements should be noted:

(1) The drawings involve only the structure(s) in connection with the embodiment(s) of the present disclosure, and other structure(s) can be referred to common design(s).

(2) For clarity, in the drawings used to describe the embodiments of the present disclosure, the thicknesses of layers or regions are enlarged or reduced, that is, the drawings are not drawn to actual scale. It can be understood that when a component such as a layer, film, region or substrate is referred to as being "on" or "under" another component, the component may be "directly" "on" or "under" another component, or one or more intermediate components may be interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display substrate, having a plurality of sub-pixels arranged in an array, and comprising:
   a driving circuit substrate, comprising a plurality of pixel driving circuits for the plurality of sub-pixels and a protective insulating layer covering the plurality of pixel driving circuits, wherein the protective insulating layer comprises a plurality of first vias exposing output terminals of the plurality of pixel driving circuits;
   a plurality of first electrodes, on the driving circuit substrate and respectively electrically connected to the output terminals of the plurality of pixel driving circuits through the plurality of first vias;
   a pixel definition layer, at least on a side of the plurality of first electrodes away from the driving circuit substrate, and comprising a plurality of sub-pixel openings respectively exposing the plurality of first electrodes and comprising at least one partition structure on the pixel definition layer; and
   a light-emitting material layer, on a side of the pixel definition layer away from the driving circuit substrate and at least in the plurality of sub-pixel openings, wherein the pixel definition layer comprises a first pixel definition sub-layer and a second pixel definition sub-layer, the second pixel definition sub-layer is on a side of the first pixel definition sub-layer away from the driving circuit substrate, and a width of the second pixel definition sub-layer is greater than a width of the first pixel definition sub-layer;
   a sidewall of each of the at least one partition structure comprises a first notch; at a position of the at least one partition structure, the first pixel definition sub-layer is inwardly shrunk relative to the second pixel definition sub-layer to form the first notch;
   the width of the second pixel definition sub-layer is smaller than a width between adjacent first electrodes.

2. A display substrate, having a plurality of sub-pixels arranged in an array, and comprising:
   a driving circuit substrate, comprising a plurality of pixel driving circuits for the plurality of sub-pixels and a protective insulating layer covering the plurality of pixe driving circuits, wherein the protective insulating layer comprises a plurality of first vias exposing output terminals of the plurality of pixel driving circuits;
   a plurality of first electrodes, on the driving circuit substrate and respectively electrically connected to the output terminals of the plurality of pixel driving circuits through the plurality of first vias;
   a pixel definition layer, at least on a side of the plurality of first electrodes away from the driving circuit substrate, and comprising a plurality of sub-pixel openings respectively exposing the plurality of first electrodes and comprising at least one partition structure on the pixel definition layer; and
   a light-emitting material layer, on a side of the pixel definition layer away from the driving circuit substrate and at least in the plurality of sub-pixel openings, wherein the pixel definition layer comprises a first pixel definition sub-layer and a second pixel definition sub-layer, the second pixel definition sub-layer is on a side of the first pixel definition sub-layer away from the driving circuit substrate, and a width of the second pixel definition sub-layer is greater than a width of the first pixel definition sub-layer;
   a sidewall of each of the at least one partition structure comprises a first notch; at a position of the at least one partition structure, the first pixel definition sub-layer is inwardly shrunk relative to the second pixel definition sub-layer to form the first notch; the first pixel definition sub-layer comprises an inorganic insulating material, and the second pixel definition sub-layer comprises an inorganic insulating material or a metal oxide material;
   a thickness of the first pixel definition sub-layer is greater than a thickness of the second pixel definition sub-layer.

3. A display substrate, having a plurality of sub-pixels arranged in an array, and comprising:
   a driving circuit substrate, comprising a plurality of pixel driving circuits for the plurality of sub-pixels and a protective insulating layer covering the plurality of pixel driving circuits, wherein the protective insulating layer comprises a plurality of first vias exposing output terminals of the plurality of pixel driving circuits;
   a plurality of first electrodes, on the driving circuit substrate and respectively electrically connected to the output terminals of the plurality of pixel driving circuits through the plurality of first vias;
   a pixel definition layer, at least on a side of the plurality of first electrodes away from the driving circuit substrate, and comprising a plurality of sub-pixel openings respectively exposing the plurality of first electrodes and comprising at least one partition structure on the pixel definition layer; and
   a light-emitting material layer, on a side of the pixel definition layer away from the driving circuit substrate and at least in the plurality of sub-pixel openings, wherein the pixel definition layer comprises a first pixel definition sub-layer and a second pixel definition sub-layer, the second pixel definition sub-layer is on a side of the first pixel definition sub-layer away from the driving circuit substrate, and a width of the second pixel definition sub-layer is greater than a width of the first pixel definition sub-layer;
   a sidewall of each of the at least one partition structure comprises a first notch; at a position of the at least one partition structure, the first pixel definition sub-layer is inwardly shrunk relative to the second pixel definition sub-layer to form the first notch; wherein the at least one partition structure comprises a plurality of first partition structures, the plurality of first partition structures respectively surround the plurality of sub-pixel openings, and first notches of the plurality of first partition structures respectively face the plurality of sub-pixel openings.

4. The display substrate according to claim 1, wherein a distance between a surface of the first pixel definition sub-layer close to the driving circuit substrate and the driving circuit substrate is greater than a distance between surfaces of the plurality of first electrodes away from the driving circuit substrate and the driving circuit substrate.

5. The display substrate according to claim 3, wherein the at least one partition structure further comprises a plurality of second partition structures, and the plurality of second partition structures are respectively arranged between two adjacent first partition structures in the plurality of first partition structures;
   a distance between the plurality of first partition structures and the driving circuit substrate is equal to a distance between the plurality of second partition structures and the driving circuit substrate; or the distance between the plurality of first partition structures and the driving circuit substrate is greater than the distance between the plurality of second partition structures and the driving circuit substrate.

6. The display substrate according to claim 5, wherein the second pixel definition sub-layer has a first slope angle at sidewalls of the plurality of first partition structures, and the first slope angle ranges from 30° to 75°; and the second pixel definition sub-layer has a second slope angle at sidewalls of the plurality of second partition structures, and the second slope angle ranges from 30° to 80°;

a slope angle of the first pixel definition sub-layer at the sidewalls of the plurality of first partition structures is greater than a slope angle of the second pixel definition sub-layer at the sidewalls of the plurality of first partition structures.

7. The display substrate according to claim 6, wherein the light-emitting material layer is disconnected at the first notch, the light-emitting material layer comprises a first portion for emitting light and a second portion not used for emitting light, the light-emitting material layer is disconnected at a position of the second portion, and a slope angle of the first portion is larger than a slope angle of the second portion at a disconnected position.

8. The display substrate according to claim 1, wherein a depth of the first notch in a direction parallel to a surface of the base substrate is greater than a thickness of the first pixel definition sub-layer and a thickness of the second pixel definition sub-layer in a direction perpendicular to the surface of the base substrate.

9. The display substrate according to claim 7, wherein the light-emitting material layer further comprises a third slope portion away from the disconnected position, and a slope angle of the third slope portion is smaller than a slope angle of the first portion close to the disconnected position and is smaller than a slope angle of the second portion close to the disconnected position.

10. The display substrate according to claim 9, wherein the pixel definition layer comprises a fourth slope portion at a position corresponding to the third slope portion, and a slope angle of the fourth slope portion is greater than the slope angle of the third slope portion;

the slope angle of the fourth slope portion is smaller than the slope angle of the first portion close to the disconnected position;

the slope angle of the fourth slope portion is smaller than the slope angle of the second portion close to the disconnected position.

11. The display substrate according to claim 5, further comprising a first auxiliary electrode layer on a side of the first pixel definition sub-layer close to the driving circuit substrate and exposed by the plurality of second partition structures;

the first pixel definition sub-layer covers an edge of the first auxiliary electrode layer.

12. The display substrate according to claim 1, wherein the at least one partition structure comprises a plurality of second partition structures, and the plurality of second partition structures are respectively arranged between the plurality of first electrodes;

a distance between a surface of the first pixel definition sub-layer away from the driving circuit substrate and the driving circuit substrate is smaller than a distance between surfaces of the plurality of first electrodes away from the driving circuit substrate and the driving circuit substrate.

13. The display substrate according to claim 12, wherein a sidewall of each of the plurality of second partition structures further comprises a second notch, and the second notch is on a side of the first notch away from the driving circuit substrate.

14. The display substrate according to claim 13, wherein the pixel definition layer further comprises a third pixel definition sub-layer and a fourth pixel definition sub-layer that are stacked, the third pixel definition sub-layer is on a side of the second pixel definition sub-layer away from the driving circuit substrate, and the fourth pixel definition sub-layer is on a side of the third pixel definition sub-layer away from the driving circuit substrate; and the third pixel definition sub-layer is inwardly shrunk relative to the fourth pixel definition sub-layer at positions of the plurality of second partition structures, so as to form the second notch.

15. The display substrate according to claim 14, further comprising:

a first auxiliary electrode layer on a side of the first pixel definition sub-layer close to the driving circuit substrate and exposed by the plurality of second partition structures; and/or a second auxiliary electrode layer on a side of the second pixel definition sub-layer away from the driving circuit substrate; and/or a third auxiliary electrode layer on a side of the fourth pixel definition sub-layer away from the driving circuit substrate.

16. The display substrate according to claim 14, wherein the second pixel definition sub-layer is disconnected by a first distance at a position of the first notch, and the fourth pixel definition sub-layer is disconnected by a second distance at a position of the second notch; and the second distance is greater than the first distance by 100 nm-500 nm.

17. The display substrate according to claim 9, further comprising:

a second electrode layer, on a side of the light-emitting material layer away from the driving circuit substrate and at least in the plurality of sub-pixel openings, wherein the second electrode layer is continuously arranged;

the second electrode layer comprises a fifth slope portion and a sixth slope portion respectively at the disconnected position corresponding to the first portion and a position of the third slope portion, a slope angle of the fifth slope portion is smaller than a slope angle of the first portion at the disconnected position, and a slope angle of the sixth slope portion is smaller than a slope angle of the third slope portion.

18. The display substrate according to claim 17, further comprising:

a light-extraction layer, on a side of the second electrode layer away from the driving circuit substrate, wherein a refractive index of the light-extraction layer ranges from 1.3 to 1.7.

* * * * *